United States Patent
Baxter et al.

(10) Patent No.: US 6,621,553 B2
(45) Date of Patent: Sep. 16, 2003

(54) APPARATUS AND METHOD FOR EXPOSING SUBSTRATES

(75) Inventors: Gregory R. Baxter, Orange, CA (US); Victor M. Jacobo, West Covina, CA (US); William J. Pappas, Claremont, CA (US)

(73) Assignee: Perkinelmer, Inc., Wellesley, MA (US)

( * ) Notice: Subject to any disclaimer, the term of this patent is extended or adjusted under 35 U.S.C. 154(b) by 306 days.

(21) Appl. No.: 09/823,253

(22) Filed: Mar. 30, 2001

(65) Prior Publication Data

US 2002/0139481 A1 Oct. 3, 2002

(51) Int. Cl.[7] .......................... G03B 27/32; G03B 27/52; G03B 27/58
(52) U.S. Cl. ............................................. 355/26; 355/72
(58) Field of Search ............................. 355/53, 26, 72, 355/75; 414/941, 935

(56) References Cited

U.S. PATENT DOCUMENTS

| | | | |
|---|---|---|---|
| 3,192,844 A | 7/1965 | Szasz et al. | .................... 95/73 |
| 3,937,579 A | 2/1976 | Schmidt | ...................... 356/144 |
| 3,963,489 A | 6/1976 | Cho | ............................ 96/27 R |
| 4,414,749 A | 11/1983 | Johannsmeier | ............ 33/180 R |
| 4,525,061 A | 6/1985 | Oki | ............................... 355/72 |
| 4,547,066 A | 10/1985 | Murai | .......................... 355/97 |
| 4,721,980 A | 1/1988 | Yazaki | ........................ 355/26 |
| 4,764,791 A | 8/1988 | Omata et al. | ................. 355/26 |
| 4,791,458 A | 12/1988 | de Masi | ....................... 355/53 |
| 4,835,078 A | 5/1989 | Harvey et al. | ................. 430/22 |
| 4,842,412 A | 6/1989 | Miyake | ........................ 356/401 |
| 4,926,489 A | 5/1990 | Danielson et al. | .............. 382/8 |
| 4,937,162 A | 6/1990 | Goirand et al. | ................ 430/22 |
| 4,937,678 A | 6/1990 | Murai et al. | ................. 358/296 |
| 4,952,060 A | 8/1990 | Ina et al. | ..................... 356/407 |
| 4,954,913 A | 9/1990 | Kajita | ........................ 358/474 |
| 4,970,587 A | 11/1990 | Abe | ............................. 358/93 |
| 4,989,035 A | 1/1991 | Leonhart | ...................... 355/93 |
| 5,006,886 A | 4/1991 | Suzuki | ........................ 355/46 |
| 5,042,709 A | 8/1991 | Cina et al. | ................... 228/105 |
| 5,050,111 A | 9/1991 | Ayata et al. | ................. 364/559 |
| 5,126,787 A | 6/1992 | Irie et al. | ....................... 355/75 |
| 5,182,615 A | 1/1993 | Kurosawa et al. | .......... 356/400 |
| 5,241,183 A | 8/1993 | Kanai et al. | ........... 250/453.11 |

(List continued on next page.)

FOREIGN PATENT DOCUMENTS

| | | |
|---|---|---|
| EP | 0618505 A1 | 10/1994 |
| JP | 63-174046 | 7/1988 |
| JP | 2-42426 | 3/1990 |
| JP | 5-102011 | 4/1993 |
| JP | 8-15866 | 1/1996 |

Primary Examiner—Russell Adams
Assistant Examiner—D. Ben Esplin
(74) Attorney, Agent, or Firm—Christie, Parker & Hale, LLP

(57) ABSTRACT

An apparatus and method for double-sided imaging of a plurality of photoresist-coated substrates is provided. The apparatus includes a first and second substrate holder comprising at least three extendable chucks, each adapted to hold the substrate. The first substrate holder is mounted about a first axis and the second substrate holder is mounted about a second axis such that the at least three chucks are capable of rotation about the first axis between at least a first, second and third chuck positions. A first transfer arm is disposed adjacent the first substrate holder and adapted to transfer the substrate to a chuck of the first substrate holder when the chuck is in the first chuck position. A first mask is positioned adjacent the chuck in the second chuck position of the first substrate holder. A second mask is provided adjacent the chuck in the second chuck position of the second substrate holder. At least one radiation source is provided for emitting radiation through the first and second masks toward the chucks in the second chuck position of each of the first and second substrate holders. A second transfer arm adjacent the second substrate holder and adapted to transfer a substrate from the third chuck position of the second substrate holder.

27 Claims, 15 Drawing Sheets

U.S. PATENT DOCUMENTS

| | | | |
|---|---|---|---|
| 5,337,151 A | 8/1994 | Baxter et al. | 356/401 |
| 5,451,130 A * | 9/1995 | Kempf | 414/27 |
| 5,530,516 A | 6/1996 | Sheets | 355/53 |
| 5,627,378 A | 5/1997 | Baxter | 250/455.11 |
| 5,686,997 A | 11/1997 | Shirasu | 356/401 |
| 5,726,738 A | 3/1998 | Sohn et al. | 355/53 |
| 5,726,739 A | 3/1998 | Hayata | 355/67 |
| 5,798,822 A | 8/1998 | Miyazaki et al. | 355/53 |
| 5,915,910 A * | 6/1999 | Howells et al. | 414/331.17 |
| 5,923,409 A * | 7/1999 | Hamada et al. | 355/72 |
| 6,211,945 B1 * | 4/2001 | Baxter et al. | 355/53 |
| 6,356,337 B1 * | 3/2002 | Zemel | 355/26 |

* cited by examiner

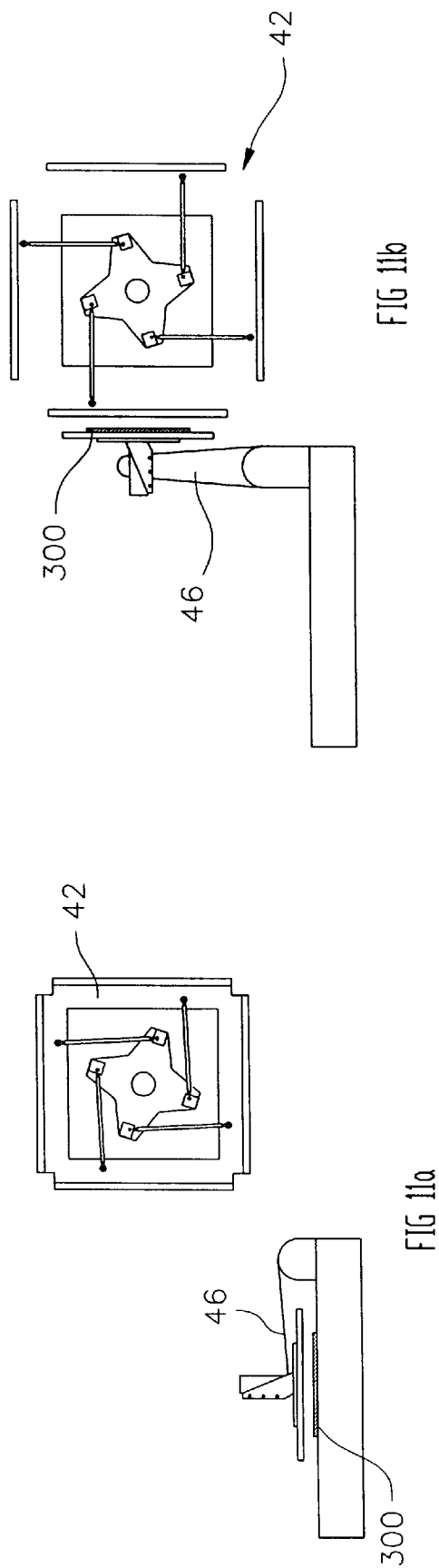

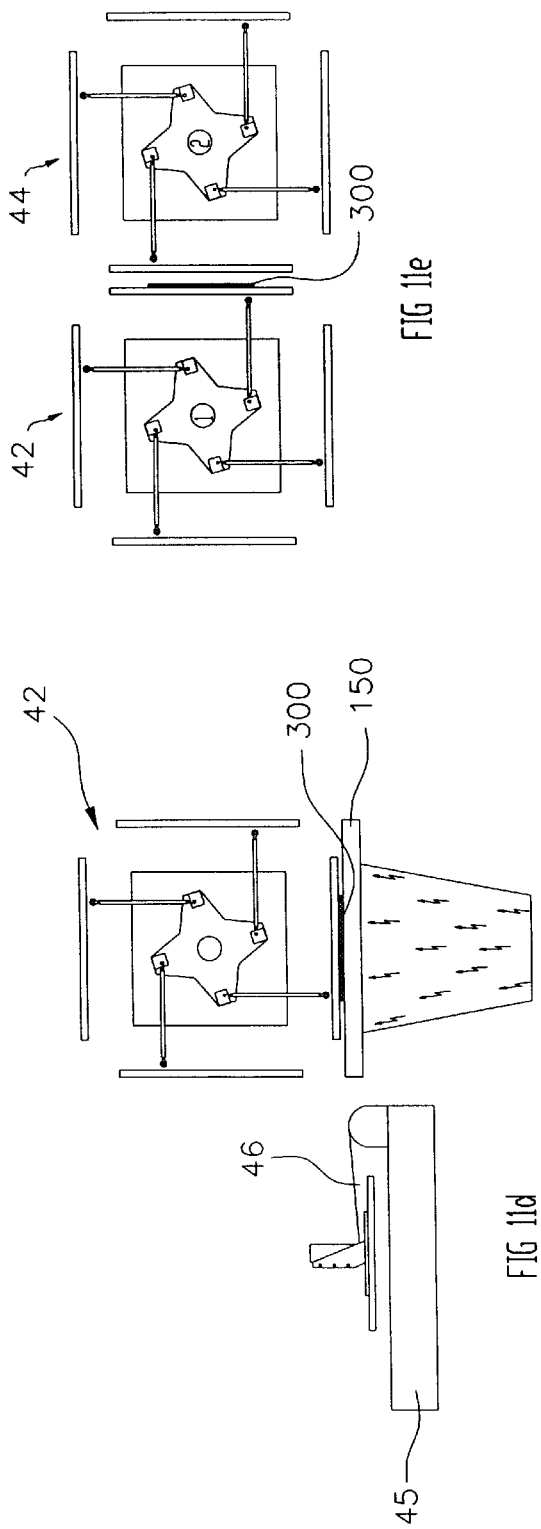

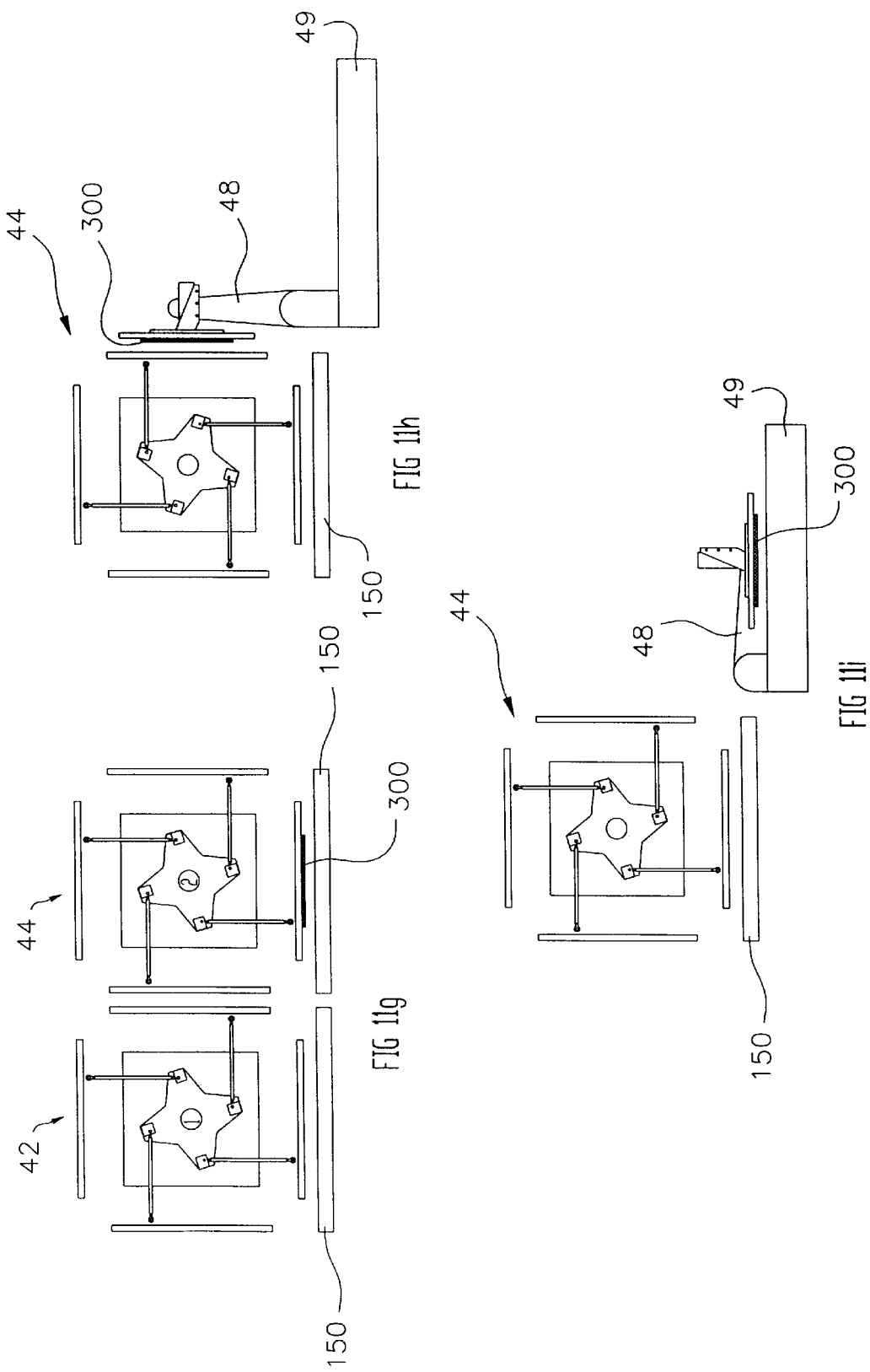

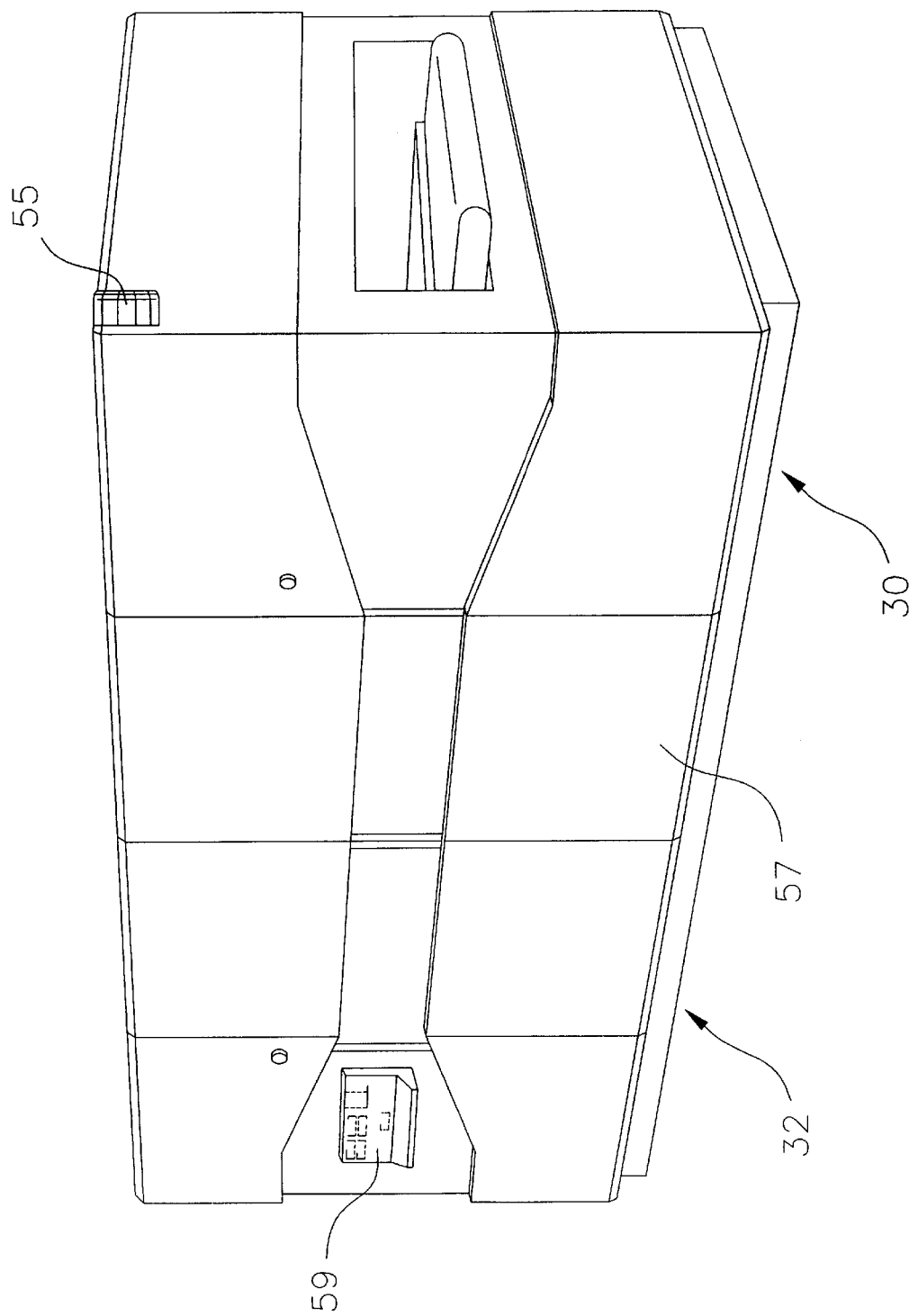

APPARATUS AND METHOD FOR EXPOSING SUBSTRATES

FIELD OF THE INVENTION

The present invention relates to equipment and methods for the photolithography of photoresist-coated substrates such as those used for high-density circuit patterns.

BACKGROUND OF THE INVENTION

The exposure of flexible and rigid electronic substrates such as those used for high density circuit patterns is generally performed with both the substrate and the photo tool, artwork, or mask in a horizontal position by a single exposure from a vertically directed collimated light beam. Conventional substrate exposure systems use various configurations of belts, suction cups, rollers and flipping mechanisms to move the substrates through the imaging process. However, for a number of reasons, such methods do not work well for flexible substrate, which are often difficult to handle and susceptible to warping. Such warping makes the accurate photolithography of the substrate virtually impossible and handling of such substrates unreliable. Another problem is that due to their acute thicknesses, these substrates typically need to be aligned to a precision within a few microns during the imaging process, making accurate and repeatable exposures difficult. Problems with repeatability lead to the frequent rejection of substrates for failing to meet minimum quality control standards.

While a number of manufacturing techniques have been developed in attempts to avoid these problems, such techniques have proven to be difficult and costly to implement. Moreover, current methods do not generally permit the quick and accurate exposure of a large number of substrates in an automated fashion.

With regard to the problem of warped substrates, thin substrates are often introduced to the machine in a warped state or are warped during the imaging process because of other upstream processes. The increased temperatures often cause the substrates to deform, making it difficult to maintain precise alignment of the substrates with the mask during the imaging process. These problems in handling make conventional exposure methods for such substrates costly, time consuming and unreliable.

Yet another difficulty with existing methods for exposing substrates has been that such exposures must generally be done in a clean room so as to avoid contaminating either the mask or the photoresist coating on the substrate with dust or dirt. Because the equipment associated with the exposure of substrates is generally very large, these exposure devices are not very compact and require a lot of space. Moreover, if the equipment is installed in a clean room, any routine maintenance can be difficult and costly due to the steps that must be taken in maintaining the clean room atmosphere.

An improved apparatus and method for exposing a large number of photoresist-coated substrates quickly, reliably and at low cost is desired.

SUMMARY OF THE INVENTION

According to the present invention an improved apparatus and method for double-sided imaging of a plurality of substrates is provided. The apparatus includes a first substrate holder comprising at least three extendable chucks, each adapted to hold the substrate. The first substrate holder is mounted about a first axis such that the chucks are capable of rotation about the first axis between at least a first, second and third chuck positions. A first transfer arm is disposed adjacent the first substrate holder and adapted to transfer the substrate to a chuck of the first substrate holder when the chuck is in the first chuck position. A first mask is provided adjacent the chuck in the second chuck position of the first substrate holder.

The apparatus also includes a second substrate holder comprising at least three extendable chucks, each adapted to hold a substrate and mounted about a second axis such that the chucks are capable of rotation about the second axis between at least first, second and third chuck positions. The first chuck position of the second substrate holder is adjacent the third chuck position of the first substrate holder. A second mask is provided adjacent the chuck in the second chuck position of the second substrate holder. At least one radiation source is provided for emitting radiation through the first and second masks toward the chucks in the second chuck position of each of the first and second substrate holders. A second transfer arm is provided adjacent the second substrate holder for transferring a substrate from the third chuck position of the second substrate holder to an out-feed of the apparatus.

In the preferred embodiment the apparatus is automated through the use of a central processing unit (CPU), and most preferably, through the use of a microprocessor. In order to expose a batch of substrates, a first sheet of substrate is driven by rollers of an in-feed conveyor towards an in-feed transfer arm. The substrate is then lifted from the in-feed conveyor and loaded onto a rotating first substrate holder comprising a plurality of extendable chucks rotatable between at least first, second and third chuck positions. The substrate is initially loaded onto a first chuck when it is in the first chuck position. Once loaded, the first chuck of the first substrate holder is rotated from its first position to a second chuck position where the chuck is extended, moving the substrate toward the first mask. A first dieset assembly that holds the first mask is lifted to place the mask in contact with the substrate and a first side of the substrate is exposed with radiation directed through the first mask. After the substrate is exposed, the first chuck of the first substrate holder is rotated to the third chuck position.

In the third position of the first substrate holder, the substrate is transferred from the first chuck of the first substrate holder to an adjoining first chuck of the second substrate holder. Once loaded, the first chuck of the second substrate holder is rotated from its first position to a second chuck position where the chuck is extended, moving the substrate toward the first mask. A second dieset assembly that holds the second mask is lifted to place the mask in contact with the substrate and a second side of the substrate is exposed with radiation directed through the second mask. After the substrate is exposed, the first chuck of the second substrate holder is rotated to the third chuck position. In the third position, the substrate is loaded onto the out-feed transfer arm, which lowers the exposed substrate onto the out-feed conveyor, thus completing the exposure cycle. In preferred embodiments, the present invention may handle up to seven or more substrates simultaneously.

BRIEF DESCRIPTION OF THE DRAWINGS

These and other features and advantages of the present invention will be better understood by reference to the following detailed description when considered in conjunction with the accompanying drawings wherein:

FIGS. 11A–I are schematic views of the preferred exposure cycle for a single substrate according to the present invention;

FIG. 12 is a perspective view of the of the exterior of the apparatus of FIG. 1.

DETAILED DESCRIPTION OF THE INVENTION

Figure 1:
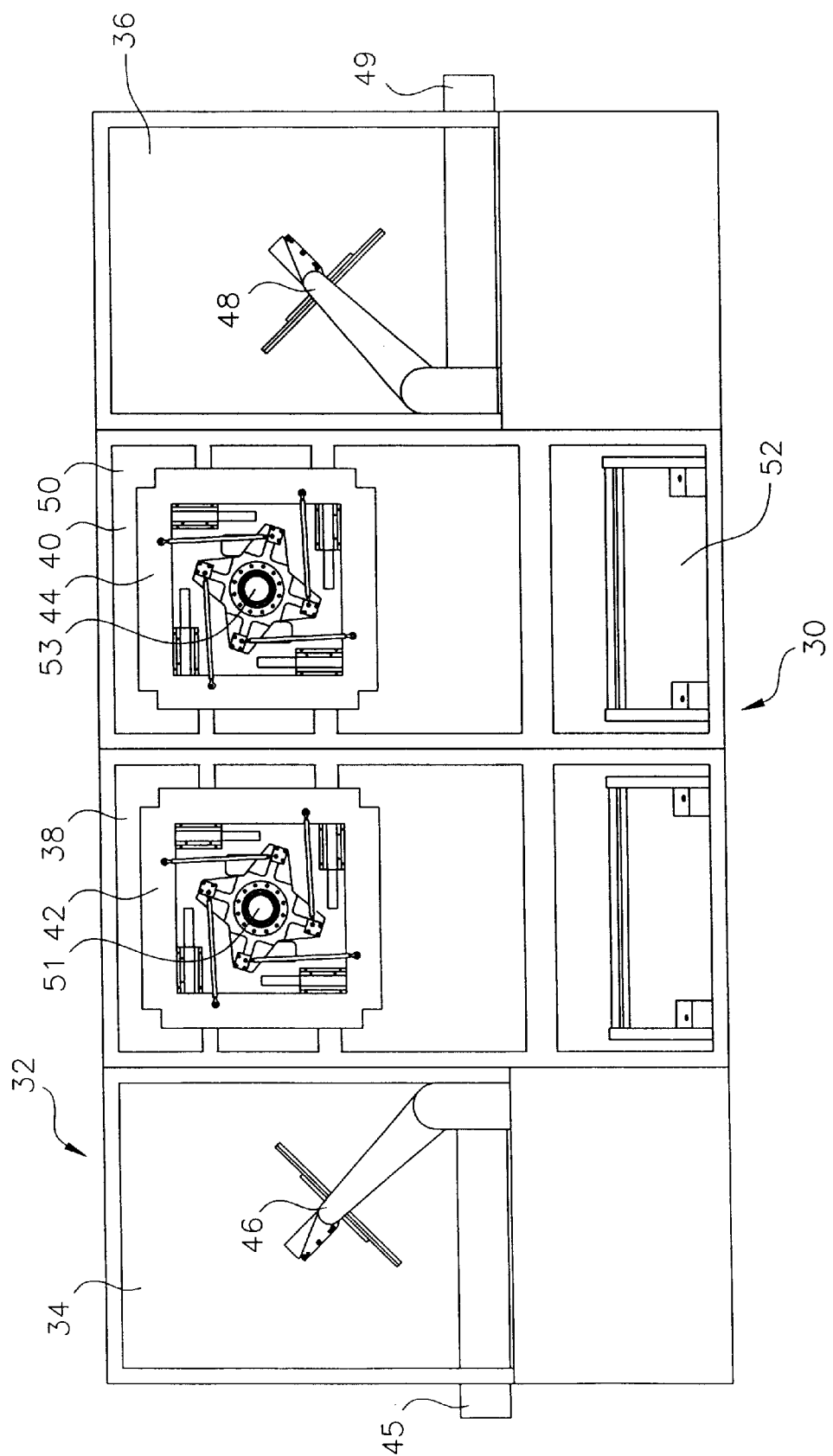
FIG. 1 is a front view of the apparatus of the present invention.

As illustrated somewhat schematically in FIG. 1, the invention is an apparatus 30 for handling and exposing a plurality of substrates to a light beam. In preferred embodiments, the apparatus is situated within a clean room and is housed within an enclosure 32. The apparatus comprises four key components: an in-feed module 34, a first substrate exposure module 38, a second substrate exposure module 40 and an out-feed module 36. The in-feed module includes an in-feed transfer arm 46 adapted to carry a pivoting in-feed substrate platen for manipulating a substrate from a generally horizontal position to a generally vertical position. A substrate in-feed conveyor 45 feeds an unexposed substrate to the platen to provide automated sequential handling of a large number of substrates for exposure to a set of masks or artwork.

The first substrate exposure module generally includes a first substrate holder 42 rotatably disposed within the enclosure about a first axis 51 adjacent the in-feed transfer arm. The first substrate holder is of a generally cubic shape and comprises four extensible vacuum chuck plates adapted to receive a substrate from the in-feed substrate platen in a first, generally vertical, position and hold the substrate as the substrate holder rotates the substrate 90° counterclockwise, as shown in FIG. 1, to a second, generally horizontal, position parallel to a first mask or artwork disposed within the enclosure. The module is accompanied by a first lamphouse 43 (FIG. 2) having collimated light beam generation equipment mounted therein for emitting radiation through the first mask, thereby exposing a first side of the substrate. Once the first side of the substrate has been exposed to the radiation, the substrate holder again rotates the substrate 90° counterclockwise to bring the substrate to a third, generally vertical, position before it is transferred to the second substrate exposure module.

The second substrate exposure module is identical to that of the first and generally includes a second substrate holder 44 rotatably disposed within the enclosure about a second axis 53 between the first substrate exposure module and the out-feed module. The second substrate holder also comprises a plurality of extensible secondary vacuum chuck plates adapted to receive a substrate in a first, generally vertical, position from an adjacent primary vacuum chuck plate and hold the substrate as the substrate holder rotates the substrate 90° counterclockwise to a second, generally horizontal, position parallel to a second mask or artwork disposed within the enclosure. The module is accompanied by a second lamphouse 45 (FIG. 2) having collimated light beam equipment mounted therein for emitting radiation through the second mask. Once a second side of the substrate has been exposed, the substrate holder again rotates the substrate further counterclockwise to bring the substrate back to a generally vertical position before it is transferred to the out-feed module.

The out-feed module includes an out-feed transfer arm 48 of a design similar to the in-feed transfer arm, adapted to carry a pivoting out-feed substrate platen. The out-feed substrate platen receives the substrate in a generally vertical position from an adjacent secondary vacuum chuck plate and manipulates the substrate from a generally vertical position to a generally horizontal position. A substrate out-feed conveyor 49 for removing the exposed substrate from the platen is provided to assist in the automated handling of a large number of exposed substrates.

In a preferred embodiment, the first and second substrate exposure modules are located in a "clean" portion 50 of the enclosure while the lamphouses and other components are housed in a separate "contaminated" portion 51 (FIG. 2) and 52 (FIG. 1), respectively, at the rear and lower half of the enclosure. By isolating the lamphouse equipment from the substrate exposure modules, maintenance and upkeep of each lamphouse is simplified. The clean portion preferably includes down draft air flow from HEPA filters installed in the rear of the enclosure atop of the lamphouses. Such clean room designs are well known in the art.

Because the equipment is housed in two separate sections of the enclosure, in order to permit a collimated light beam to be directed to the substrate, each lamphouse includes optical equipment housed within the enclosure beneath each substrate exposure module. The optical equipment is located within a compartment that adjoins the clean section and directs the collimated light beam from a light source in the lamphouse towards the substrate. The collimated beam is emitted into the clean room section through a pair of optical glass or Mylar film artworks the size of the largest mask to be used by the equipment. The pair of glass windows are provided between the clean and contaminated portions of the enclosure to expose the substrates within the first and second substrate exposure modules. Clean air is pumped into and exhaust air is drawn out of the clean room portion of the enclosure, via ducting connected to a plurality of openings along the back of the enclosure, to maintain a clean room environment in the exposure modules.

Figure 3:
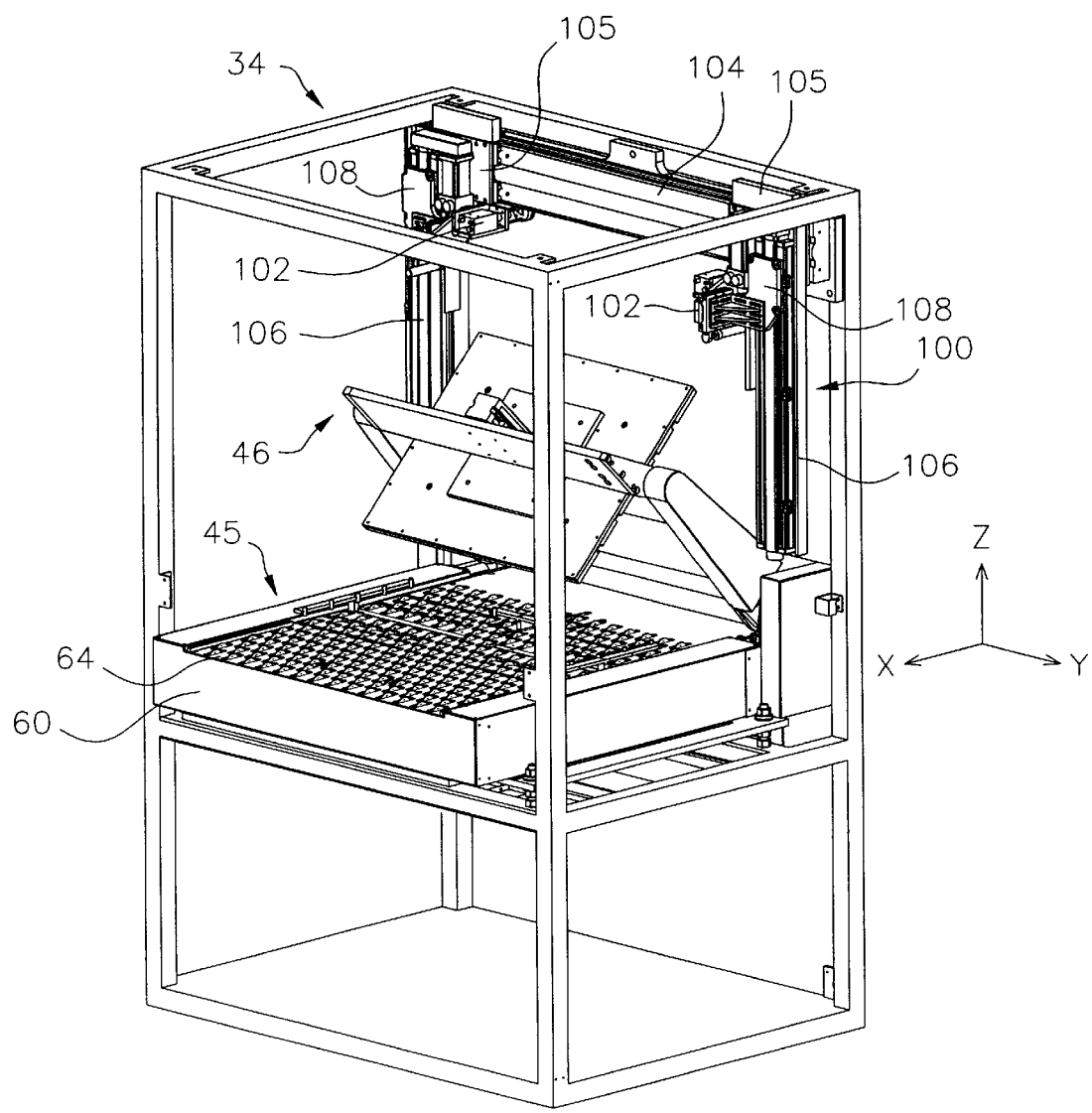
FIG. 3 is a perspective view of the in-feed module of the apparatus of FIG. 1.

To simplify the discussion of the of the various components, a number of axes are defined at FIG. 3. The horizontal axis parallel to the general direction of travel of the substrate passing through the apparatus is generally referred to as the x-axis. The substantially horizontal axis perpendicular to the x-axis is generally referred to as the y-axis. The substantially vertical axis perpendicular to the x- and y-axes is the z-axis.

Figure 2:
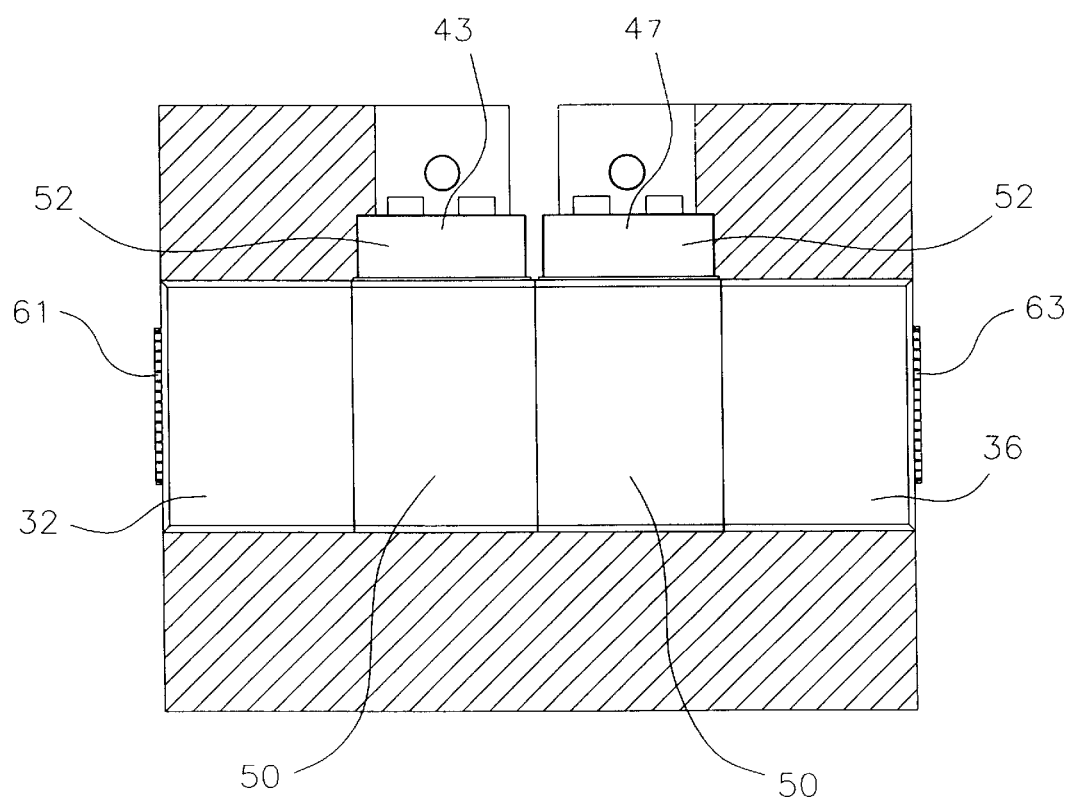
FIG. 2 is a schematic plan view of the apparatus of FIG. 1.

Referring to FIGS. 2 and 3, the in-feed module includes an in-feed opening 61 for receiving a substrate at the end of the module distant the first substrate exposure module and an in-feed transfer arm 46 at an opposite end proximate the first substrate exposure module. The in-feed module also includes an in-feed conveyor positioned between the in-feed opening and in-feed transfer arm.

Figure 4:
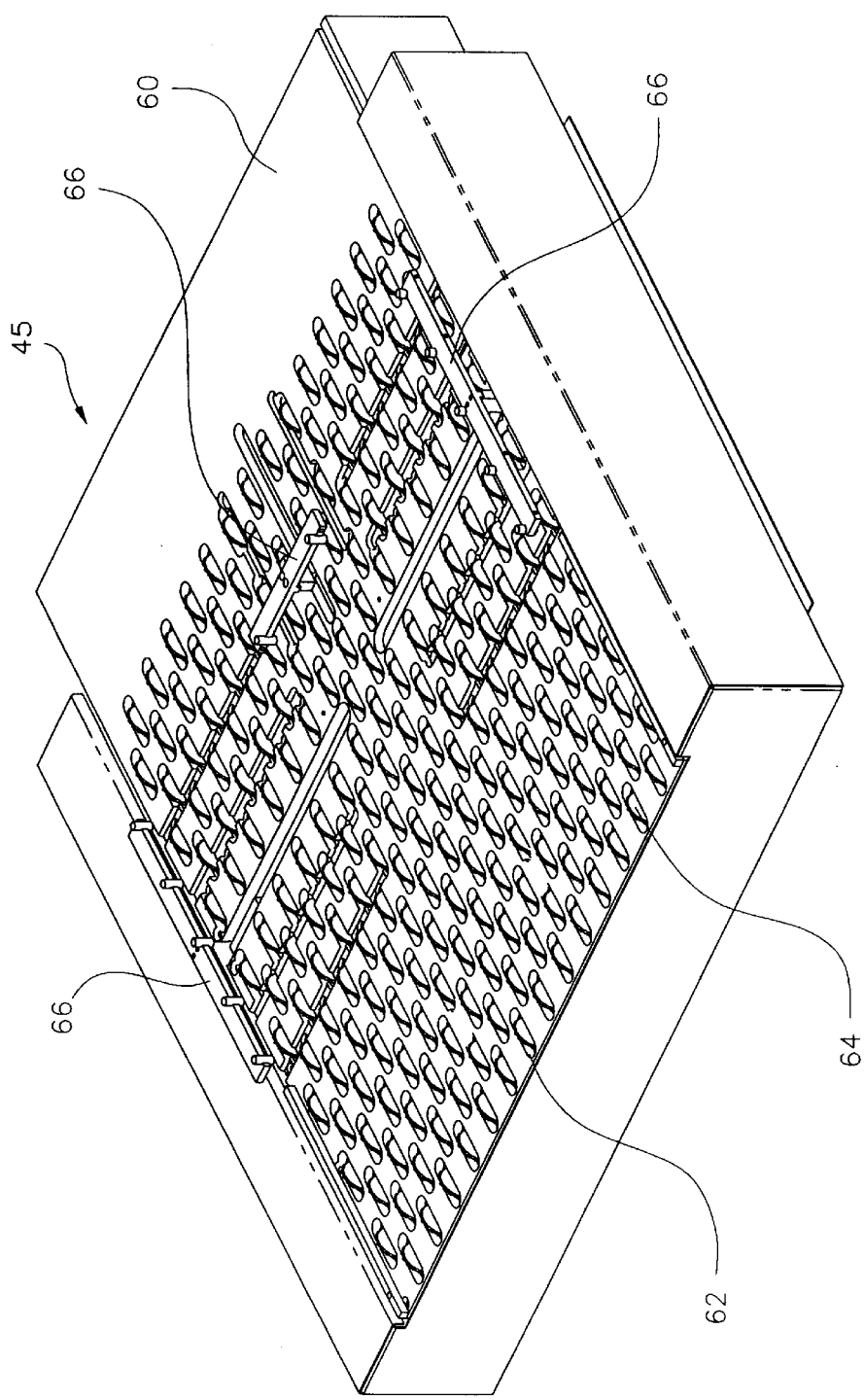
FIG. 4 is a perspective view of the in-feed conveyor table.

Referring to FIGS. 3 and 4, the in-feed conveyor 45 comprises a horizontal in-feed table 60 having a plurality of slots 62 for receiving in-feed drive rollers 64 (FIG. 3) that project above the in-feed table to move the substrate towards the in-feed transfer arm. The in-feed rollers comprise an array of rubber wheels coupled to one another by gears and driven by a motor by means well known in the art. Once the substrate is moved to a location proximate the in-feed transfer arm, the in-feed table is raised, lifting the substrate above the in-feed rollers. Snubber pins 66 are provided on the in-feed table to perform an initial alignment of the substrate on the in-feed conveyor before the substrate is transferred to the in-feed transfer arm. In a preferred embodiment, a first and second set of snubber pins are provided at opposite sides of the in-feed table to move inward, along the y-axis, towards the center of the table to snub the substrate to a center position along the x-axis. Similarly, a third set of snubber pins are provided near the rear of the in-feed table to move inward, along the x-axis, towards the center of the table to snub and center the substrate on a third side. The snubber pins are translated along a set of tracks located in the in-feed table using positioning tables (not shown) as are known in the art. An optional position sensor (not shown) may also be provided to determine the location of a substrate so that the system's CPU will know the location of a substrate during processing. The CPU may be connected to the motor driving the in-feed rollers to stop the movement of the substrate along the in-feed conveyor if the platen is not ready for receiving it.

Figure 5:
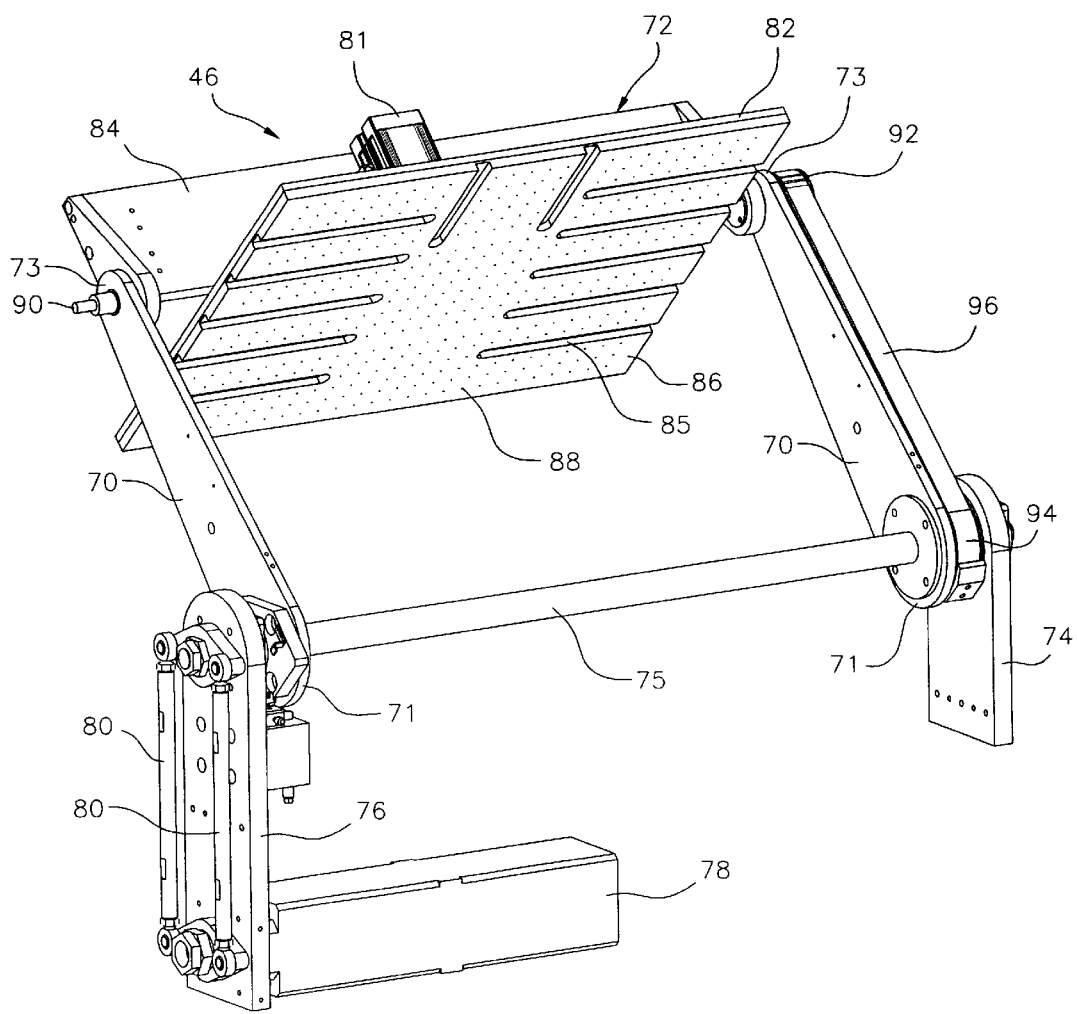
FIG. 5 is a perspective view of the in-feed transfer arm.
Figure 6:
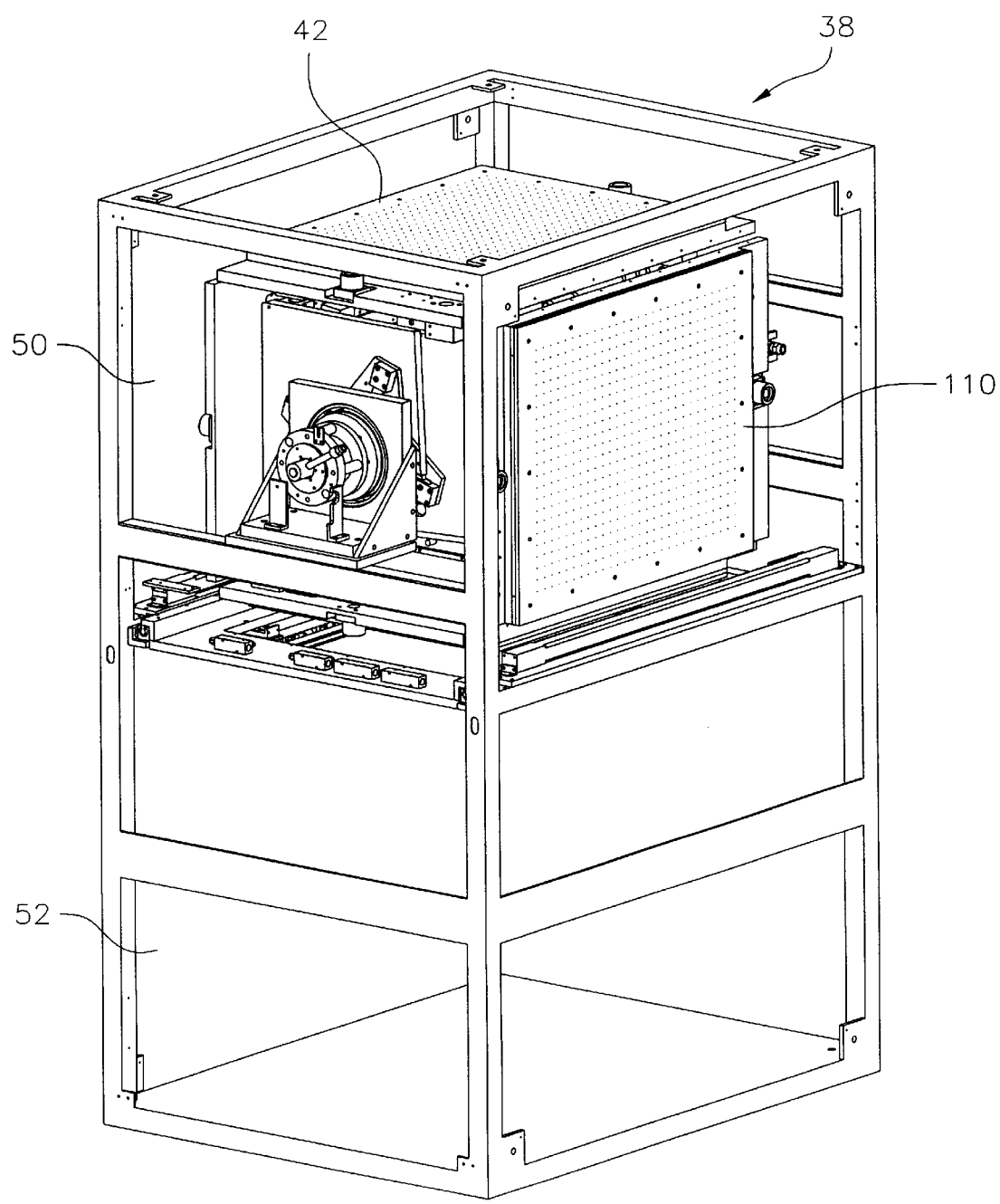
FIG. 6 is a perspective view of an exposure module of the apparatus of FIG. 1.

Once the substrate is centered at the terminal end of the in-feed conveyor, an in-feed transfer arm 46 picks-up the substrate in a generally horizontal position and simultaneously lifts and pivots the substrate from the substantially horizontal position to a substantially vertical position. The substrate is then transferred to a vacuum chuck plate of the first exposure module, also in a substantially vertical position. As shown in FIG. 5, the in-feed transfer arm includes a pair of pulley plates 70 that rotate between a substantially horizontal position and a substantially vertical position, and an in-feed substrate platen 72 pivotally coupled between the pulley plates. The pulley plates are preferably made of aluminum and have proximal ends 71 that are coupled together by a driveshaft 75. The driveshaft is preferable a solid stainless steel rod that extends through the proximal ends of the pulley plates in a hinged arrangement with pulley mounts 74 and 76 coupled to the in-feed conveyor. The pulley mounts are preferably aluminum brackets attached to sides of the in-feed table to support the driveshaft and the pulley plates are tilted from a substantially horizontal position to a substantially vertical position relative to the in-feed table. The driveshaft is coupled to a reversible motor 78 by a pair of preferably stainless steel linking rods 80 that rotate the pulley plates 90 degrees between the substantially horizontal and vertical positions.

The in-feed substrate platen 72 is carried by the pulley plates at their distal ends. The in-feed substrate platen includes a platen vacuum chuck 82 that is carried by a pneumatic cylinder 81 having internal linear bearings. The cylinder is supported by a bridge plate 84 that extends and is rotatably coupled between distal ends of the pulley plates. The platen chuck includes a platen plate 86 having a plurality of vacuum ports 88 disposed about its perimeter. The platen plate is configured to receive a substrate as the vacuum ports are preferably disposed over a sufficient surface area of the platen plate to firmly hold the substrate in place. The platen plate is also configured to flatten the substrate against the in-feed table to straighten out any warpage in a thin substrate. When a vacuum is applied to the vacuum ports by a vacuum source (not shown) the substrate is held firmly in place on the platen plate.

While the in-feed substrate platen illustrated is for substrates having dimensions of approximately 21"×27", it is apparent that the platen can easily be modified to accommodate smaller size substrates. Substrates as small as approximately 10"×10" can be handled by the device illustrated.

As mentioned above, the in-feed substrate platen, via the bridge plate, is rotatably coupled between the pulley plates by a pair of pins 90 that outwardly extend from bridge through the distal ends of the pulley plates. A transfer pulley 92 mounted to an end of one of the pins is coupled to a drive pulley 94 mounted to an end of the driveshaft by a drive belt 96 that extends along the length of one of the pulley plates. The belt transfers rotational movement of the drive pulley to the transfer pulley as the reversible motor rotates the driveshaft 90 degrees. As such, the transfer pulley rotates the platen chuck 180 degrees with respect to the transfer arm, such that when the 90 degree rotation of the transfer arm is taken into consideration, the substrate is rotated a total of 90 degrees between a substantially horizontal position and a substantially vertical position. In a preferred embodiment, the diameter of the drive pulley is twice as large as the transfer pulley to provide a 2:1 ratio so that the 90 degrees of rotation for the transfer arm provides the desired 180 degrees of rotation for the platen chuck with respect to the transfer arm.

The reversible motor is controlled by the system's CPU which sequentially provides a signal to motor to actuate movement of the transfer arm in synchronization with the substrate exposure cycle.

Referring back to FIG. 3, after the platen chuck is rotated to the substantially vertical position, the substrate is transferred from the transfer arm to the first exposure module. Then, the in-feed transfer arm retracts back to its substantially horizontal position to receive a second substrate while a pair of pre-alignment imaging devices such as digital cameras, and preferably charge coupled device cameras (CCD cameras) 102, coupled to a CCD camera pre-alignment subassembly 100 scan the substrate to find imaging targets or fiducials imprinted on the substrate. The CCD camera pre-alignment subassembly includes a horizontal track 104 which is mounted to an upper region the in-feed module's frame and a pair of vertical tracks 106 mounted to shuttles 105 that translate along the horizontal track. The shuttles are driven by linear motors which translate the vertical tracks inwards and outwards along the horizontal track in the y-direction. Each of the CCD cameras is driven by servo motors 108 that translate along the vertical track up and down in the z-direction. The pre-alignment CCD camera functions to "pre-align" the position of the mask relative to the substrate during imaging, as will be described in more detail later.

Figure 7:
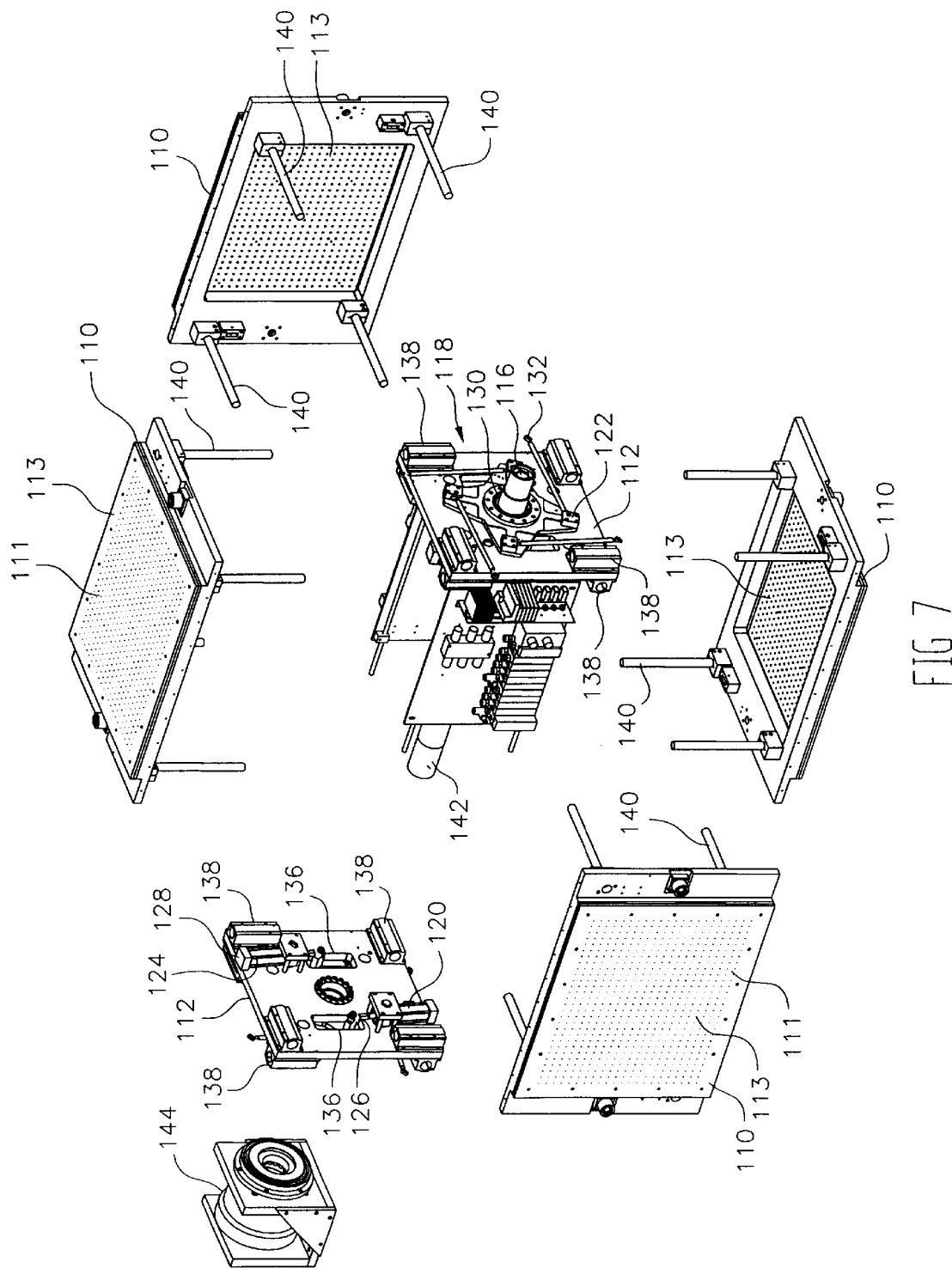
FIG. 7 is a exploded view of the substrate holder of the exposure module of FIG. 6.
Figure 8:
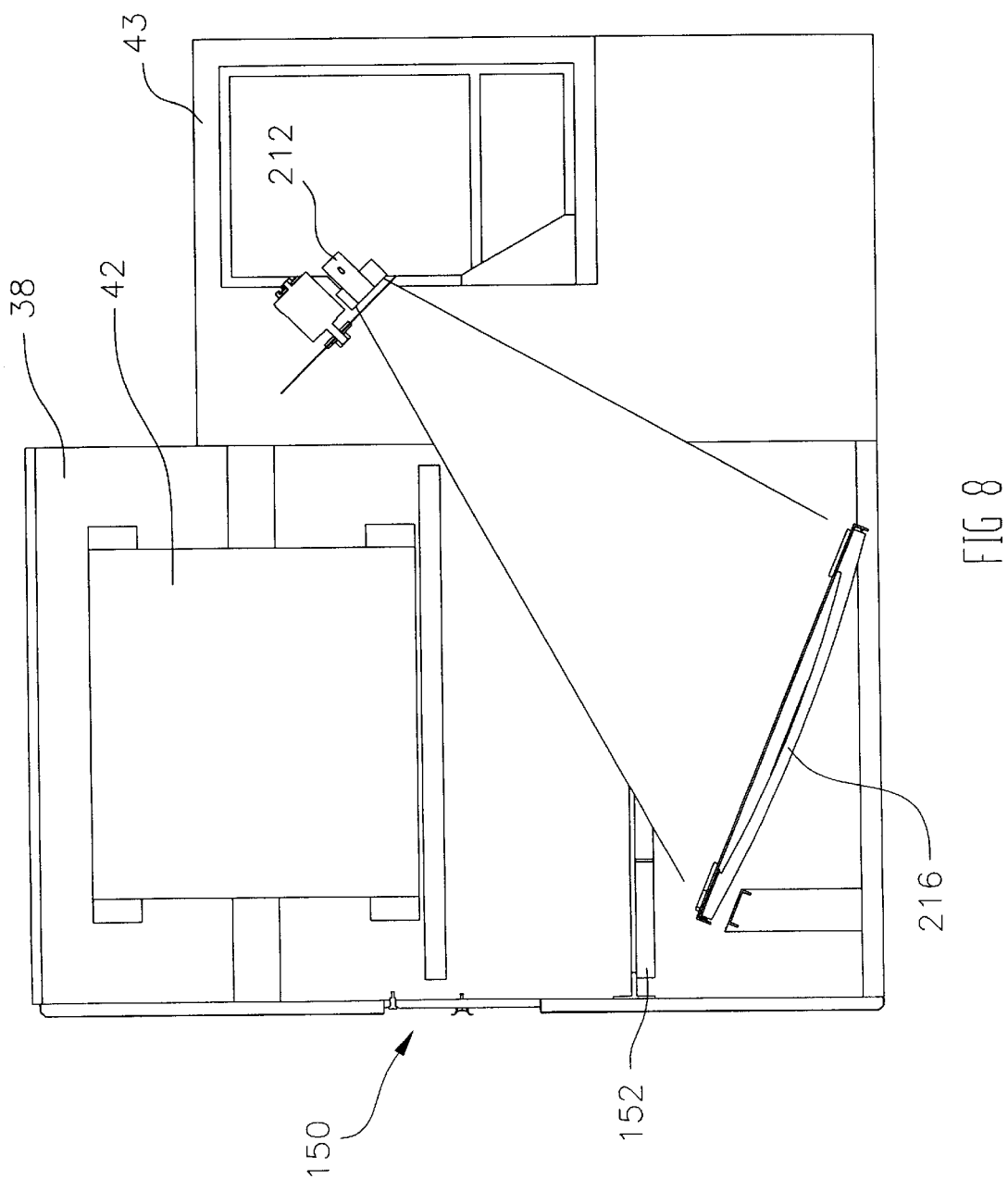
FIG. 8 is a sectional side view of the exposure module of FIG. 6.

As mentioned above, the transfer arm transfers the substrate from the in-feed module to the first exposure module. Referring to FIGS. 7 and 8, the first exposure module 38 includes a set of four primary vacuum chucks 110 that are extensible from a pair of hub plates 112 to form the first substrate holder 42. In a preferred embodiment, the first substrate holder is of approximately cubic construction. The substrate holder is rotatably coupled to the enclosure 32 by a cube shaft 116 extending through a central portion the stationary hub plates. The cube shaft defines the first axis 51 about which the substrate rotates. The chucks and hub plates are preferably made of aluminum, but may be made from any suitable material.

Each primary chuck provides a surface whereby the substrate is held in place as the substrate is rotated through the first expose module. In a preferred embodiment, each primary vacuum chuck comprises a chuck plate 111 having a plurality of vacuum ports (not shown) disposed about the area of the contact surface to firmly hold the substrate in place. Preferably, each chuck plate also includes a plurality of apertures 113 that form a grid which extends within the periphery of the vacuum ports to provide the chuck plate with a perforated surface. The perforated surface of the chuck plate enables any air pockets formed between the substrate and the chuck plate to bleed off, facilitating solid contact between the substrate and chuck plate. Gasket strips (not shown) may be applied on either side of vacuum ports to assist in forming an airtight seal between the chuck plate and substrate. When a vacuum is applied to the vacuum ports by a vacuum source (not shown) the substrate is held firmly to the chuck plate. While the chucks illustrated are for substrates having dimensions of a approximately 21"×27", it is apparent that the chucks can easily be modified to accommodate smaller size substrates.

It is also important that since the chuck plate stays in contact with the substrate during its exposure, it should, in some instances, include a finish that prevents reflection of the exposure light which could adversely affect the quality of the finished substrate. Therefore, in a preferred embodiment the chuck plate will be provided with a flat black finish to maximize its light absorbency. In such embodiments, a flat black anodized finish is applied to the chuck plate. In other embodiments, it may be desirable to have some reflection of the exposure light. In these embodiments, no finish is applied to the chuck plate.

As noted earlier, the primary chucks are extensible from the stationary hub plates and operably move away from and towards the stationary hub plates between an extended position and a retracted position. The primary chucks are displaced by a pair of translation mechanisms 118 coupled to the interior of the cubic structure. Each translation mechanism comprise a pair of pneumatic cylinders 120 mounted to the inner surface of the stationary hub plates and a panel wheel 122 that is rotatably coupled to the exterior surface of the stationary hub plates about the rotating cube shaft.

The pneumatic cylinders are conventional devices that comprise a housing 124 and piston rod 126 that extends and retracts from the housing under the influence of compressed air pressure. The compressed air is fed to the housing though a pressure regulator (not shown). The pressure within the housing is varied by a pressure signal transmitted to the regulator from a CPU (not shown). The pressure signals are accurately timed to extend and retract the piston rod at appropriate times during operation, as will be discussed later.

In a preferred embodiment, the pneumatic cylinders are mounted to the inner surface of the stationary hub plates about the cube shaft in an opposing fashion such that piston rods extend in an opposing, yet parallel relation. The piston rods are coupled to the panel wheel to rotate it clockwise when the piston rods are retracting and counterclockwise when the piston rods are extending.

The panel wheel is preferably an aluminum plate formed in the shape of a "4-point" star. The panel wheel includes a central bore 130 that extends through its center and a plurality of translating rods 132 coupled to each "point" of the star at their proximal ends. The panel wheel is rotatably mounted about a central portion of the stationary hub plate's exterior surface such that the cube shaft extends through the central bore. A pair of bearings (not shown) are rotatably coupled to the underside of the panel wheel at two opposing points. The bearings outwardly extend from wheel's underside though a pair of slits 136 formed in the hub plates. The bearings are coupled to the piston rods of the pneumatic cylinders, which act to rotate the panel wheel clockwise and counter clockwise.

The primary chucks are coupled to the panel wheels at distal ends of the translating rods. When the panel wheels are rotated counterclockwise by the pneumatic cylinders, the translating rods act on the chucks to move them away from the stationary hub plates. Similarly, when the panel wheels are rotated clockwise, the translating rods act on the chucks to move them towards the perimeter of the stationary hub plates.

The primary vacuum chucks are confined to a lateral translation by a plurality of alignment shafts 140 mounted to their undersides which slide in and out of a plurality of translation bearings 130 mounted about the exterior corners of the stationary hub plates. The shafts are preferably made from steel to prevent any gouging or sticking of the shafts within the bearings during lateral translation.

The first substrate holder is rotated about the cube shaft by a motor 144 attached to the rear of the enclosure. The motor is synchronized by the CPU during operation. Rotation of the first substrate holder and the panel wheels are controlled such that the holder only rotates when the vacuum chucks are in their retracted positions.

Referring back to the in-feed transfer arm, during the substrate transfer process between the in-feed module and the first exposure module, the primary chucks are displaced to their extended positions while the in-feed substrate platen moves the substrate towards an adjacent vertical primary chuck. Once the transfer arm positions the substrate in a substantially vertical position juxtaposed the primary chuck, the substrate platen is actuated to place the substrate in contact with the chuck plate of the primary chuck. As the substrate is brought into abutment with the chuck plate, the vacuum applied to vacuum ports of the substrate platen is discontinued and a slight positive pressure is applied to the ports to blow the substrates off of the platen surface. Simultaneously, vacuum is applied to the vacuum ports of the vacuum chuck to hold the substrate in place.

After the transfer takes place, the transfer arm is retracted to its horizontal position and the vacuum chucks are moved to their retracted positions and the substrate holder is rotated 90° counterclockwise from its first, substantially vertical position, to a second, substantially horizontal, position to place the unexposed substrate in a substantially horizontal position proximate a first mask.

As shown in FIG. 8, subsequent to placing the substrate in a substantially horizontal position, the vacuum chuck plates are displaced from their retracted positions to their extended positions, moving the substrate towards a mask subassembly 150 positioned beneath the first exposure module. The mask subassembly forms the top portion of the compartment and comprises a mask loader drawer 152 which is positioned atop of a dieset assembly 154.

Figure 9:
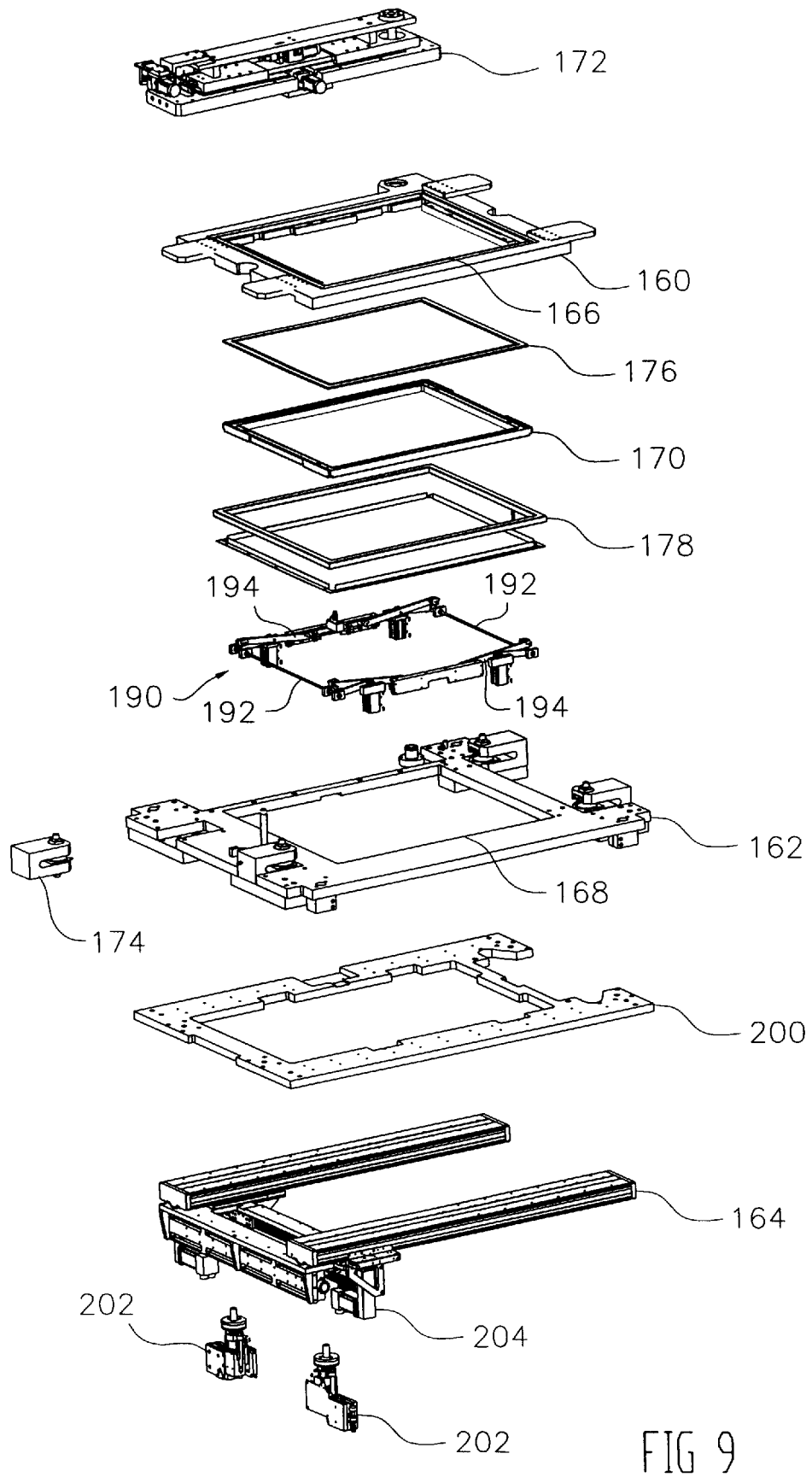
FIG. 9 is an exploded perspective view of a mask subassembly.

Referring to FIG. 9, the dieset assembly is made up of an alignment stage plate 160, a dieset plate 162, and a dieset CCD camera stage subassembly 164. The alignment stage plate and the dieset stage plate are each made from aluminum and comprise cut-outs 166 and 168 having the approximate size of the largest mask pattern to be accommodated by the equipment. In a preferred embodiment the equipment is generally designed to accommodate a mask large enough for the photolithography of a substrate having dimensions approximately 21"×27".

The alignment stage plate is the portion of the dieset assembly that actually holds a phototool frame 170 that receives the artwork or mask. The alignment stage plate is mounted atop of the dieset plate with a plurality of bolts. An alignment module 172 coupled to sides of the alignment stage plate is used for fine adjustments of the orientation of the mask in the x-, y- and θ directions to properly align the mask with the substrate. Such alignment modules are well known in the art. In addition, the alignment stage plate is mounted onto the dieset plate by four air bearings approximately positioned at each of its corners to permit movement in the x- and y-directions as well as rotation of the alignment stage about the z-axis in a plane parallel to the substrate in order to insure that the mask is properly aligned with the to the plane of the substrate. For convenience, the amount of rotation about the z-axis is defined as angle θ.

Referring to FIG. 8, in a preferred embodiment, the mask is placed atop of a phototool glass 176 which is held within the phototool frame. The phototool frame sits within the cutout of the alignment stage plate and the phototool glass and the mask are secured to the phototool frame by applying a vacuum to two sets of vacuum ports (not shown) disposed along the inner and outer perimeters of the phototool frame.

The alignment stage plate holds the phototool frame in place by a vacuum applied to one or more vacuum ports (not shown) formed about the perimeter of the cut-out. The alignment stage plate also includes an inflatable seal 178 disposed about the outer side of the vacuum ports that inflates in contact with an adjacent vacuum chuck plate to create an airtight exposure chamber between the mask and the substrate.

In order to permit the equipment to be used for smaller substrates, an adapter phototool frame (not shown) may be mounted within the cutout of the alignment stage plate and held in place by the vacuum ports about the perimeter of the phototool frame cutout. The adapter frame comprises a series of vacuum channels that route the vacuum applied by the phototool vacuum ports to vacuum ports about the perimeter of the adapter frame to hold the Mylar or glass mask of the adapter frame in place. Various different sizes of adapter frames can be provided to accommodate the exposure of different sizes of substrates. The adapter frame is designed to accommodate the mask used for photolithography of substrates used for high-density circuit patterns.

As shown in FIG. 9, an imaging device such as a CCD camera stage subassembly is mounted beneath the dieset plate by a plurality of bolts. A camera subplate 200 is disposed between the dieset plate and the camera stage assembly. The dieset CCD camera stage assembly includes a pair of dieset CCD cameras 202 carried by a shuttle 204 which translates in the y-direction along a pair of parallel rails 206 mounted to the underside of the camera subplate. The shuttle is driven along the rails by linear motors controlled by the system's CPU. The CPU sends digitized data to the linear motor which translates the shuttle axially along the length of the substrate to the pre-aligned fiducial locations. Additionally, the dieset CCD cameras are mounted on carriages which translate along the shuttle in the x-direction to enable the camera to scan the substrate for fiducials along the x- and y-axes. The carriages are driven by rotating lead ball screws which are driven by servo motors controlled by the system's CPU.

The dieset CCD cameras are needed to evaluate the alignment of the substrate fiducials relative to the mask targets. As mentioned above, while in the in-feed module, the position of the dieset assembly is pre-aligned or adjusted relative to the substrate. This is accomplished by moving the pre-alignment CCD cameras inward from their initial outboard positions to scan the substrate along the y- and z-directions to find fiducials imaged on the substrate about its perimeter. In a preferred embodiment, the fiducials are drilled holes or imaged fiducials about 0.060 inches in diameter. The pre-alignment CCD cameras mainly function to align the dieset relative to the substrate such that the dieset CCD camera may be able to register the substrate fiducial locations because printed circuit boards hole patterns are not always precise with respect to the edge patterns of the circuit boards, as the profile of the circuit board may not be square. The pre-alignment CCD camera registers and digitizes the virtual fiducial locations and these locations are processed by the system's onboard CPU (not shown) which creates a digital map of the substrate fiducials and uses this data to control the alignment of the dieset mask relative to the substrate. In this process, the position of the mask is "pre-aligned" with the substrate.

In a preferred embodiment, the mask includes preferably two to four targets positioned about its perimeter at each of its corners. The targets are preferably drill holes having dimensions about 0.080 inches in diameter. During the alignment stage, the fiducials of the substrate are aligned with the targets of the mask to ensure that the mask is properly aligned with the substrate during exposure.

In the preferred embodiment, the substrate is exposed using a contact exposure method in which the substrate and mask are placed in direct contact with one another. However, it should be apparent that the device illustrated could be modified so that rather than being placed in direct contact with one another, the substrate and mask are placed in close proximity to one another for exposure. The determination of how close the substrate and mask should be will depend on the level of accuracy required for the exposure, the quality of the collimated light beam, the flatness of the substrate, and other factors recognized by one of skill in the art.

According to the preferred embodiment, after the substrate has been extended by the substrate holder toward the mask, the dieset lifts the mask into contact with the substrate. Once the mask is brought into contact with the substrate, the dieset CCD cameras check the alignment of the substrate fiducials relative to the mask targets. In the event that the fiducials are misaligned with the mask targets, the dieset is slightly lowered, preferably no more than $\frac{3}{16}$ of an inch, and the system's CPU activates the alignment modules and the air bearings to adjust the alignment of the mask relative to the substrate in the x-, y- and θ directions. After the dieset is adjusted, the dieset is again lifted to bring the mask in contact with the substrate and the relative alignment of the substrate fiducials with respect to the mask targets is checked again. In a preferred alignment, this sequence of steps is repeated until the substrate fiducials are properly centered within the mask target to within an accuracy of ±2 microns. Once the mask is properly aligned with the substrate, the dieset CCD cameras are moved outwards, out of the path of the exposure and the substrate is exposed to a collimated light beam directed through the mask from the compartment below.

The system CPU, which communicates between the pre-alignment CCD cameras of the in-feed module and the dieset CCD cameras of the first exposure module, calibrates the change in position of the digitized fiducial locations of the substrate as it is moved from the in-feed module to the first exposure module. As the system continues in operation, the difference between the alignment locations become constant and establishes a relationship between the fiducial locations registered by the pre-alignment CCD cameras and the target locations registered by the dieset CCD cameras, whereby the alignment of the mask relative to the substrate of the first exposure module highly repeatable and can be accurately predicted with few iterations. Thus, the system becomes "smarter" with continuous operation to provide faster substrate processing.

Turning back to FIG. 8, the light source subassembly includes equipment for generating a collimated beam of light as is generally known in the art. This equipment specifically includes a lamphouse 43 preferably containing at least a 5 kw, or more preferably an 8 kw UV lamp 212 for generating a beam of ultraviolet light. The lamphouse is mounted in the rear of the enclosure and is powered by a power supply (not shown), for example a 208–480 VAC, 3 phase unit. The beam of light from the lamphouse is directed to a collimating mirror 216 producing a collimated light beam. The collimated light beam is then directed through the phototool glass, where the mask is held in alignment with the substrate in order to expose the substrate.

The equipment for directing the collimated beam of light is mounted in the compartment beneath the clean room section. The entire light source equipment is oriented so that the collimated light beam is perpendicular to the mask and substrate. The collimated beam is able to provide a beam of generally precisely uniform intensity at all points of the exposure field, such that a rectangular aperture will provide uniform exposure of the substrate. For example, a substrate having dimensions about 21"×27" exposed to a 8 kW UV lamp will expose each side of the substrate to a uniformity of about ±10%. In a preferred embodiment, the substrate is imaged at a resolution as low as approximately about 25 microns.

After the substrate is properly exposed to the UV light, the vacuum chucks are displaced from their extended positions to their retracted positions and the cubic structure is rotated counterclockwise to again bring the substrate into a substantially vertical position. When the substrate is brought to the substantially vertical position, the vacuum chucks are again displaced from their retracted positions to their extended positions. Simultaneously, an adjacent vertical vacuum chuck of the second exposure module is extended in abutment with the vacuum chuck of the first exposure module, sandwiching the substrate between the abutting vacuum chucks.

In this position, the substrate is transferred from the first exposure module to the second exposure module. As the vacuum applied to vacuum ports of the chuck plate of the first exposure module is discontinued and a slight positive pressure is applied to the ports to blow the substrate off of the chuck plate's contact surface. Simultaneously, a vacuum is applied to the vacuum ports of the adjacent vertical chuck plate of the second exposure module to hold the substrate in place. Thus, the substrate is virtually "flipped" to expose a second side of the substrate.

The second exposure module, which can also be represented by FIGS. 7 and 8, comprises the second substrate holder 44 which operates and functions like the first substrate holder 42 of the first exposure module. Once the substrate is secured to a vertical vacuum chuck of the second substrate holder, the vacuum chucks are retracted towards its stationary hub plates and the substrate holder rotates the substrate 90° counterclockwise from the substantially vertical position to a substantially horizontal position proximal a second mask subassembly 252.

The mask subassembly of the second exposure module operates and functions like the mask subassembly of the first exposure module. The mask assembly similarly includes an mask loader subassembly for changing the mask for the second exposure module and a dieset assembly for positioning the mask relative to the substrate. The dieset subassembly similarly includes a second dieset CCD camera stage subassembly that operates and functions like the CCD camera stage subassembly of the first exposure module. A second pair of dieset CCD cameras are provided in the second CCD camera stage subassembly. These cameras move to the target positions digitized by the dieset CCD cameras of the first exposure module to verify alignment of the substrate fiducials relative to the mask targets of the mask in the second exposure module. The system CPU, which is connected between the dieset CCD cameras of the first exposure module and the dieset CCD cameras of the second exposure module, calibrates the change in position of the digitized substrate alignment locations of the first exposure module from the second exposure module. As the system continues in operation, the difference between the alignment locations become constant and the alignment of the mask relative to the substrate of the second exposure module can be accurately predicted with little additional adjustments. Thus, the system becomes "smarter" with continuous operation. In a preferred embodiment, the apparatus may expose up to 5 substrate per minute.

Similar to the cubic structure of the first exposure module, the horizontal vacuum chuck proximal the dieset assembly is extended from its retracted position towards the mask of the second exposure module. Once the vacuum chuck is fully extended to bring the substrate proximal the mask of the second exposure module, the dieset is raised to bring the mask into contact with the into contact the substrate, the alignment of the mask relative to the substrate is verified, and if properly aligned, an inflatable seal of the second alignment stage plate is expanded in contact with the horizontal vacuum chuck and the second side of the substrate is exposed to a collimated light beam in like character to the collimated light beam of the first exposure module.

After the substrate is properly exposed to the light source, the vacuum chucks are displaced from their extended positions to their retracted positions and the second substrate holder is rotated 90° counterclockwise to bring the substrate again into a substantially vertical position. When the substrate is brought to the substantially vertical position, the vacuum chucks are again displaced from their retracted positions to their extended positions. Simultaneously, an out-feed substrate platen of the out-feed transfer arm is rotated in contact with the substrate.

For simplicity, FIG. 3 illustrates the transfer arm of the in-feed module which operates substantially the same as the out-feed transfer arm, excluding the pre-alignment CCD camera assembly. The out-feed transfer arm is positioned adjacent the second exposure module and like the in-feed transfer arm, comprises a pair of pulley plates that pivot about their proximal ends and are operably connected at their distal ends to an out-feed substrate that rotates 90° between a substantially vertical position and a substantially horizontal position. The out-feed substrate platen includes a platen surface having a plurality of vacuum ports disposed about its perimeter. The platen surface is configured to receive the substrate, as the vacuum ports are preferably disposed over a sufficient surface area of the platen surface to firmly hold the substrate in plate.

Once the out-feed substrate platen is brought into close proximity to the adjacent vertical vacuum chuck of the second exposure module, the vacuum applied to the ports of the vacuum chuck is discontinued and a slight positive pressure is applied to the ports to "blow" the substrate off of the vacuum chuck. Simultaneously, a vacuum is applied to the ports of the out-feed substrate platen to hold the substrate in place on the out-feed substrate platen surface. After the transfer has been completed, the adjacent vertical vacuum chuck is retracted and the out-feed transfer arm is rotated to move the substrate from a substantially vertical position to a substantially horizontal position.

In the substantially horizontal position, the vacuum applied to the ports of the out-feed substrate platen is discontinued and the exposed substrate is placed onto an out-feed conveyor. Like the in-feed conveyor, the out-feed conveyor includes a horizontal out-feed table having out-feed drive rollers that project above the out-feed table to move the substrate away from the out-feed transfer arm. The out-feed rollers comprise an array of rubber wheels coupled to one another by belts and are driven by a motor by means well known in the art.

FIGS. 11A–I illustrate somewhat schematically the exposure cycle for a single substrate. As shown in FIG. 11A, a photoresist-coated substrate is drawn into the apparatus by the in-feed rollers of the in-feed conveyor. The in-feed rollers draw the substrate towards the in-feed platen until a position sensor senses the substrate and sends a signal to the system's CPU, which then stops further movement of the substrate by the rollers. As the substrate is stopped from movement, the in-feed table is raised above the rollers and the snubbing pins of the in-feed conveyor are extended to engage and center the substrate on the conveyor. As shown in FIG. 5, the in-feed substrate platen plate 84 has grooves 85 that accept the snubber pins to prevent the warped substrate from "climbing" over the pins during snubbing. The substrate is "caged" during this operation. Once the substrate has been properly centered, the vacuum chuck of the in-feed transfer arm is extended to flatten the substrate against warpage. A vacuum is applied to the vacuum chuck to pick up the substrate and hold it on the platen plate while the transfer arm translates the substrate from a substantially horizontal position to a substantially vertical position proximal a vertical vacuum chuck of the first exposure module.

Referring to FIG. 11B, in the vertical position, the vacuum applied to the vacuum ports of the in-feed platen is discontinued and a slight positive pressure is applied to the ports to "blow" the substrate off of the platen into contact with the adjacent vacuum chuck. Simultaneously, a vacuum is applied to the vacuum ports of the adjacent vacuum chuck to hold the substrate in place against the chuck plate. At this point, the pair of pre-alignment CCD cameras (not shown for simplicity) scan the substrate for fiducial locations. The fiducial locations are digitized by the system's CPU which uses the information to move the dieset assembly to prealign the mask relative to the substrate.

After the substrate fiducial locations have been digitized, the pre-alignment CCD cameras are retracted, the vacuum chucks of the first substrate holder are retracted, and the substrate holder is rotated 90° counterclockwise (as shown in FIG. 11C) to place the substrate in a substantially horizontal position. While the substrate holder is rotating, the dieset is being adjusted to align with the fiducial locations registered by the pre-alignment CCD cameras. In the horizontal position, the vacuum chucks are displaced to their extended positions to move the substrate towards the dieset assembly to place it in close proximity to the mask and the dieset assembly is lifted to place the mask in contact with the substrate.

Referring to FIG. 11D, at this point, the dieset CCD cameras are used to check the alignment of the substrate fiducials relative the mask targets. If the mask and substrate are not properly aligned, the dieset is lowered and the alignment modules of the dieset assembly are engaged to adjust the relative position of the mask in the x-, y- and θ directions. After the dieset is adjusted, the dieset is again lifted to bring the mask into contact with the substrate and the alignment of the mask relative to the substrate is checked again. These steps are repeated until the alignment is within a desired tolerance.

Once the mask and substrate are aligned, the CCD camera are retracted back to their initial positions, the lamphouse shutter is opened and a first side of the substrate is exposed to the collimated light beam. Once exposure is complete, the lighthouse shutter is closed, the dieset is lowered, the vacuum chucks of the first substrate holder are retracted, and the holder is then further rotated 90° counterclockwise to again bring the substrate to a substantially vertical position.

Referring to FIG. 11E, after the newly exposed substrate has been brought back to a substantially vertical position, the vacuum chucks of the first exposure module are extended into contact with an adjacent vacuum chuck of the second exposure module. At this point, the substrate is "transferred" from the first exposure module to the second exposure module, as the vacuum applied the vacuum ports of the vacuum chuck of the first exposure module is discontinued and a slight positive pressure is applied to the ports to blow the substrate into contact with the abutting vacuum chuck of the second exposure module. Simultaneously, a vacuum is applied to the vacuum ports of the vacuum chuck of the second exposure module to hold the substrate firmly in place on the chuck plate. After the substrate is transferred to the second exposure module, the vacuum chucks of the second exposure module are retracted and the cubic structure is rotated 90° counterclockwise (FIG. 11F) to place the substrate in a substantially horizontal position proximal the second mask or artwork. Simultaneously, the dieset assembly of the second exposure module is adjusted to the same digitized locations of the dieset of the first exposure module, as the alignment data from the first exposure module is used to position the CCD cameras and align the dieset assembly of the second exposure module As illustrated in FIG. 11G, once the substrate is brought to the substantially horizontal position, the vacuum chucks of the second exposure module are extended to bring the substrate in close proximity to the second mask and the dieset assembly is raised to contact the substrate. At this point, the alignment of the mask relative to the substrate is again checked and corrected. This step is generally accomplished in a fashion similar to that of the first exposure module. Once the mask and substrate are aligned the lamphouse shutter is opened and a second side of the substrate is exposed to the collimated light beam. Once the exposure is complete, the lamphouse shutter is closed, the dieset is lowered, the vacuum chucks of the second exposure module are retracted, and the cubic structure is rotated 90° counterclockwise to again bring the substrate into a substantially vertical position.

Referring to FIG. 11H, as the substrate holder of the second exposure module is rotated such that the substrate is in the substantially vertical position the vacuum chucks of the second exposure module are extended to bring the substrate into the contact with the vacuum chuck of the out-feed transfer arm. The substrate is then "blown off" of the vertical vacuum chuck and held in place by the out-feed substrate platen by vacuum. Then, as shown in FIG. 11I, the out-feed transfer arm rotates the substrate from a substantially vertical position to a substantially horizontal position proximal the out-feed conveyor. The vacuum applied by the vacuum ports of the out-feed substrate platen is discontinued to place the exposed substrate onto the out-feed rollers of the out-feed conveyor which then move the exposure substrate from the platen to an out-feed opening.

In a preferred embodiment, the invention simultaneously handles as many as seven substrates. During a single step of the cycle, a first unexposed substrate is in the process of being transferred by the in-feed conveyor while a second unexposed substrate is being transferred from the in-feed transfer arm to a first vacuum chuck of the first exposure module. A third unexposed substrate is held on a second vacuum chuck of the first exposure module for exposure by the first radiation source. A fourth partially exposed substrate is held on a third vacuum chuck of the first exposure module to be transferred to a first vacuum chuck of the second exposure module. A fifth partially exposed substrate is held on a second vacuum chuck of the second exposure module for exposure by the second radiation source. A sixth fully exposed substrate is held by a third vacuum chuck of the second exposure module to be transferred to the out-feed transfer arm. And finally, a seventh fully exposed substrate is being transferred from the apparatus by the out-feed conveyor.

In preferred embodiments, as shown in FIG. 12, the apparatus 30 is protected by the enclosure preferably made from aluminum and having dimension approximately 166 inches in length, approximately 83 inches in height, and approximately 59 inches in width. The enclosure comprises a plurality of access and maintenance panels 57 for accessing various components of the apparatus. The access panels are provided with safety latches that can only be opened by a key. For safety precautions, all of the access panels are interlocked with the machine controls to stop moving parts while the panels are opened.

A user interface 59 to the CPU is built into a front panel of the enclosure. The user interface preferably consists of a color touchscreen monitor with all operation sequences, real-time process animation, menu-driven screens, on-line help and multilingual support. In a preferred embodiment, the interface is a 17" diagonal flat panel color touchscreen. The user interface allows the operator to supervise the operation of the apparatus via a real time animated model of the system that appears on the touchscreen. The real time animation shows on the screen the rotation of the substrate holders and transfer arms, as well as keeps track of the panel flow through the system. The highly intelligent control system self-diagnoses and presents conditions to the operator via the user interface screen as well as through the use of a three light beacon 55 located at the upper corners of the enclosure.

To maintain a clean room environment, a set of collapsible baffles (not shown) may be fastened between edges of the vacuum chucks to enclose the substrate holders and prevent any particulate generated by the moving parts from falling into or escaping its interior. While the baffles function to enclose the substrate holders, the enclosure is not air tight. This allows air to flow from the clean portion of the enclosure to the substrate holder interior. An exhaust system draws the exhaust air through the cube shaft in order to draw particulate from the substrate holder interior though a set of exhaust ports 142 displaced along the shaft. This flow of air draws any particulates out from the enclosure to maintain the clean portion of the enclosure at a class 100 environment.

The present invention provides highly accurate double-sided substrate exposures at high imaging resolutions. The apparatus of the present invention additionally provides increased production capacity by exposing a plurality of substrates at high throughput rates. In a preferred embodiment, the apparatus handles up to 7 substrates at a time, providing substrate processing cycle times as low as approximately 12 seconds per panel, including approximately 3 seconds exposure and registration time. Moreover, the modular design of the present invention may be easily integrated into existing substrate processes, as the apparatus requires no custom tooling, panel pushers, suckers or pins, does not require any artwork punching, and is relatively compact in comparison to other substrate imaging machines.

Figure 13:
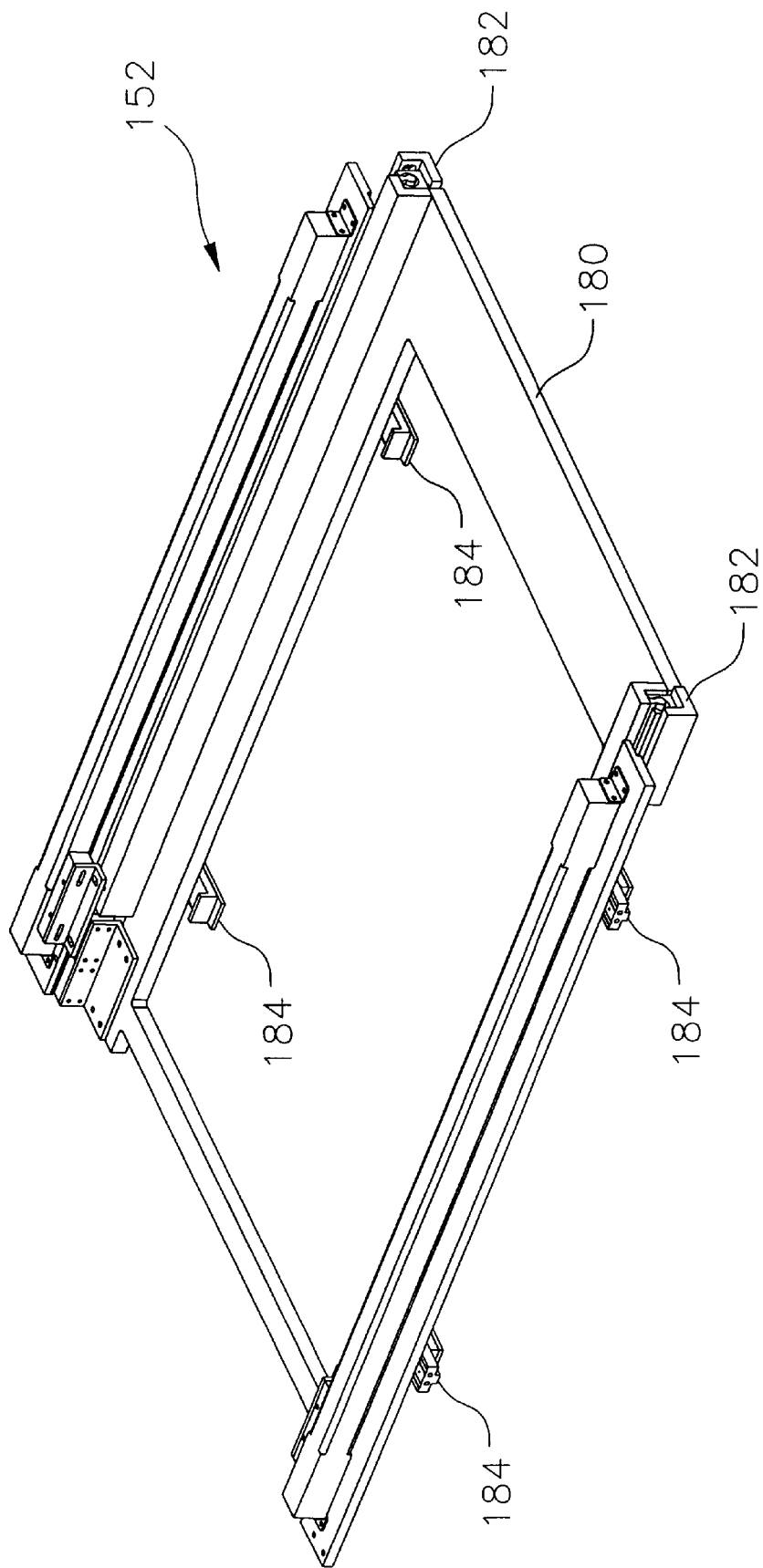
FIG. 13 is a perspective view of a mask loader assembly.

As an added feature of the preferred embodiments, as shown in FIG. 8, an mask loader drawer 152 may be mounted within the clean portion of the enclosure between the substrate holder and the dieset assembly. As illustrated in FIG. 13, the loader drawer includes a loader frame 180 that translates in and out of the enclosure along a pair of rail guides 182 mounted to the structure of the clean room. A side panel of the enclosure may be opened to allow the operator to engage the loader drawer. The loader frame is adapted to receive and secure the phototool frame when lifted from the alignment stage plate. As the phototool frame is lifted, a set of four pneumatic latches 184 carried by the loader frame are inwardly extended to support and secure the phototool about its four corners. Once the phototool frame is secured to the loader frame, the loader frame, which now carries both the phototool frame and the mask, is automatically translated from the clean room section of the enclosure along a conveyor (not shown). Once the loader drawer is translated out of the enclosure, the mask may be changed. After the mask is changed, the loader frame may be translated back into the clean room section and the phototool frame may be released from the loader frame and lowered back into position within the cut-out of the alignment stage plate. The loader drawer may be activated by user through automation.

Figure 10:
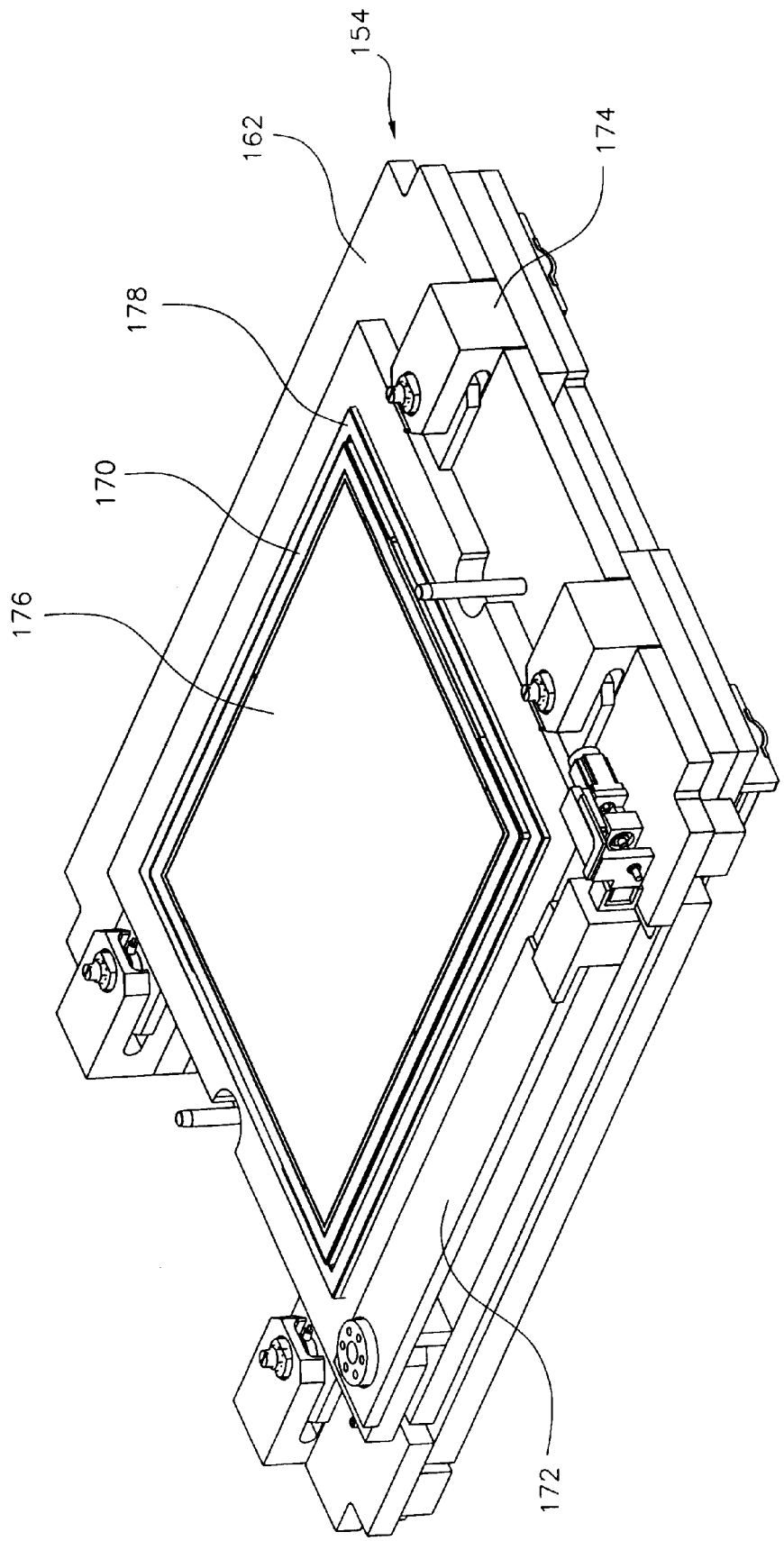
FIG. 10 is a perspective view of the mask assembly of FIG. 9.

Referring to FIGS. 9 and 10, a lift linkage assembly 190 mounted to the dieset plate is used to lift the phototool frame from the alignment stage plate into contact with the loader frame. The lift linkage includes a pair of lifting members 192 that contact and lift the phototool frame from its underside. The lifting members rotate about of pair of pivots 194 to lift the phototool up and down. The lift linkage assembly can be operated either manually or electromechanically.

In preferred embodiments, the apparatus is designed to handle substrates made of any type of material, for example FR4/3/5, BT and Cu, and of any thickness, preferably having a thickness between approximately 25 microns to about 3.0 milliemters.

In an alternative embodiment, it may be desirable to only perform single-sided imaging. As such, the apparatus may comprise only a single substrate exposure module with in-feed and out-feed modules as set forth above.

While in the preferred embodiments of the present invention the substrate has been described as translating through the apparatus in a left-to-right operation, in alternative embodiments, the substrate may translate through the apparatus in a right-to-left operation.

Furthermore, while the exposure modules have generally been described as each including four chucks rotating about a horizontal shaft and arranged in a cubic structure, other geometries are possible. For example, the faces of the chucks could be rectangular in shape rather than squares. Moreover, while the preferred embodiment uses four chucks rotating about a horizontal shaft, a vertical shaft with vertical exposure could also be used. In yet another embodiment, fewer chucks could be used. For example, three chucks rotatably mounted about a shaft could be used for each exposure module with a first chuck positioned to receive a substrate for exposure, a second chuck positioned to expose the substrate to the radiation source, and a third chuck positioned to transfer an exposed substrate.

Having thus described the preferred embodiment of the invention, it would be apparent to one of skill in the art that numerous other revisions could be made without deviating from the intended spirit and scope of the invention. Therefore, the invention is intended to be defined not by the specific features of the preferred embodiment as disclosed, but by the scope of the following claims.

What is claimed is:

1. An apparatus for exposing first and second sides of a plurality of substrates to radiation through first and second masks, the apparatus comprising:
    a first substrate holder comprising at least three extendable chucks, each adapted to hold a substrate and mounted about a first axis such that the at least three chucks are capable of rotation about the first axis between at least first, second and third chuck positions;
    a first mask holder adjacent the second chuck position of the first substrate holder and adapted to hold the first mask;
    a second substrate holder comprising at least three extendable chucks, each adapted to hold a substrate and mounted about a second axis such that the at least three chucks are capable of rotation about the second axis between at least first, second and third chuck positions, the first chuck position of the second substrate holder being adjacent the third chuck position of the first substrate holder;
    a second mask holder adjacent the second chuck position of the second substrate holder and adapted to hold the second mask; and
    at least one radiation source for emitting radiation through the first and second masks toward the chucks in the second chuck position of each of the first and second substrate holders.

2. The apparatus of claim 1 wherein the first mask holder further comprises a first dieset assembly adapted to position the first mask in proximity to a first substrate held by the chuck in the second chuck position of the first substrate holder; and the second mask holder further comprises a second dieset assembly adapted to position the second mask in proximity to a second substrate held by the chuck in the second chuck position of the second substrate holder.

3. The apparatus of claim 2 wherein each substrate includes at least two fiducials, the apparatus further comprising:
    a pre-alignment imaging device adjacent the first chuck position of the first substrate holder and adapted to register the positions of the at least two fiducials of a substrate held by a chuck in the first chuck position of the first substrate holder; and
    means for moving the first mask holder based on the positions of the at least two fiducials of the substrate.

4. The apparatus of claim 2 wherein each of the first and second masks includes at least two targets and each of the first and second dieset assemblies further comprises:
    a dieset plate;
    an alignment stage plate moveably coupled to the dieset plate and to which the corresponding mask is held;
    an imaging device to determine the relative positions between the targets and the fiducials; and
    means for moving the respective mask holder based on the relative positions between the targets and the fiducials.

5. The apparatus of claim 1 further comprising a first transfer arm adjacent the first substrate holder and adapted to transfer a substrate to a chuck of the first substrate holder when the chuck is in the first chuck position, and a second transfer arm adjacent the second substrate holder and adapted to transfer a substrate from a chuck in the third chuck position of the second substrate holder.

6. The apparatus of claim 1 wherein each chuck is a vacuum chuck.

7. The apparatus of claim 1 wherein each of the first and second substrate holders comprises four extendable chucks arranged equidistant about the corresponding axis.

8. An apparatus for exposing first and second sides of a plurality of substrates to radiation through first and second masks, the apparatus comprising:
    a first substrate holder comprising at least three extendable chucks, each adapted to hold a substrate and mounted about a first axis such that the at least three chucks are capable of rotation about the first axis between at least first, second and third chuck positions;
    a first transfer arm adjacent the first substrate holder and adapted to transfer a substrate to a chuck of the first substrate holder when the chuck is in the first chuck position;
    a first mask holder adjacent the second chuck position of the first substrate holder;
    a second substrate holder comprising at least three extendable chucks, each adapted to hold a substrate and mounted about a second axis such that the at least three chucks are capable of rotation about the second axis between at least first, second and third chuck positions, the first chuck position of the second substrate holder being adjacent the third chuck position of the first substrate holder;
    a second mask holder adjacent the second chuck position of the second substrate holder;
    at least one radiation source for emitting radiation through the first and second masks toward the second chuck position of each of the first and second substrate holders; and
    a second transfer arm adjacent the second substrate holder and adapted to transfer a substrate from the third chuck position of the second substrate holder.

9. The apparatus of claim 8 further comprising a first conveyor adjacent the first transfer arm to move a substrate toward the first transfer arm.

10. The apparatus of claim 9 further comprising a second conveyor adjacent the second substrate holder and adapted to receive a substrate from the second transfer arm.

11. The apparatus of claim 8 further comprising a dieset assembly for positioning the mask and the substrate in proximity to one another.

12. The apparatus of claim 11 wherein each substrate includes at least two fiducials, the apparatus further comprising:

a pre-alignment imaging device adjacent the first chuck position of the first substrate holder and adapted to register the positions of the at least two fiducials of a substrate held by a chuck in the first chuck position of the first substrate holder; and means for moving the first mask holder based on the positions of the at least two fiducials of the substrate.

13. The apparatus of claim 11 wherein each of the first and second masks includes at least two targets and each of the first and second dieset assemblies further comprises:

a dieset plate;

an alignment stage plate moveably coupled to the dieset plate and to which the corresponding mask is held;

an imaging device to determine the relative positions between the targets and the fiducials; and means for moving the respective mask holder based on the relative positions between the targets and the fiducials.

14. The apparatus of claim 8 wherein each chuck is a vacuum chuck.

15. The apparatus of claim 8 wherein the first substrate holder comprises four extendable chucks arranged equidistant about the first axis and the second substrate holder comprises four extendable chucks arranged equidistant about the second axis.

16. An apparatus for exposing at least a first side of a plurality of substrates to radiation comprising:

a substrate holder comprising at least three extendable chucks, each adapted to hold a substrate and mounted about an axis such that the at least three chucks are capable of rotation about the axis between at least first, second and third chuck positions;

a transfer arm adjacent the substrate holder and adapted to transfer a substrate to a chuck of the substrate holder when the chuck is in the first chuck position;

a first mask adjacent the second chuck position of the substrate holder;

a radiation source for emitting radiation through the first mask toward a substrate held by a chuck in the second chuck position of the substrate holder; and a transfer chuck adjacent the substrate holder and adapted to transfer a substrate from a chuck in the third chuck position of the substrate holder.

17. The apparatus of claim 16 wherein the substrate holder is a first substrate holder, the chucks of the first substrate holder are mounted about a first axis, and the transfer arm is a first transfer arm, the apparatus further comprising:

a second substrate holder comprising at least three extendable chucks, each adapted to hold a substrate and mounted about a second axis such that the at least three chucks are capable of rotation about the second axis between at least first, second and third chuck positions, wherein the chuck in the first chuck position of the second substrate holder is the transfer chuck;

a second mask adjacent the second chuck position of the second substrate holder; and a second transfer arm adjacent the second substrate holder and adapted to transfer a substrate from a chuck in the third chuck position of the second substrate holder.

18. The apparatus of claim 16 further comprising a dieset assembly for positioning the mask and the substrate in proximity to one another.

19. The apparatus of claim 18 wherein each substrate includes at least two fiducials, the apparatus further comprising:

a pre-alignment imaging device adjacent the first chuck position of the substrate holder and adapted to register the positions of the at least two fiducials of a substrate held by a chuck in the first chuck position; and means for moving the mask based on the positions of the at least two fiducials of the substrate.

20. The apparatus of claim 19 wherein the mask includes at least two targets and the dieset assemblies further comprises:

a dieset plate;

an alignment stage plate moveably coupled to the dieset plate and to which the mask is held;

an imaging device to determine the relative positions between the targets and the fiducials; and means for moving the mask based on the relative positions between the targets and the fiducials.

21. The apparatus of claim 16 wherein the substrate holder comprises four extendable chucks arranged equidistant about the axis.

22. A method for exposing the first and second sides of a plurality of substrates to radiation comprising the steps of:

loading a substrate onto a rotating first substrate holder comprising a plurality of extendable chucks rotatable between at least first, second and third chuck positions, the substrate being loaded to the first chuck when it is in the first chuck position;

rotating the first chuck of the first substrate holder to the second chuck position and extending the substrate toward a first mask;

exposing the first side of the substrate with radiation directed through the first mask while the first chuck of the first substrate holder is in the second chuck position;

rotating the first chuck of the first substrate holder to the third chuck position;

transferring the substrate from the first chuck of the first substrate holder to a second rotating substrate holder, the second substrate holder comprising a plurality of extendable chucks rotatable between at least first, second and third chuck positions, the substrate being transferred to the first chuck of the second substrate holder when it is in the first chuck position;

rotating the first chuck of the second substrate holder to the second chuck position and extending the substrate toward a second mask; and exposing the second side of the substrate with radiation directed through the second mask while the first chuck of the second substrate holder is in the second chuck position.

23. The method of claim 22 further comprising the steps of:

determining the position of the substrate with respect to the first chuck; and moving the first mask based on the position of the substrate.

24. The method of claim 23 wherein the step for determining the position of the substrate with respect to the first chuck occurs while the first chuck is in the first chuck position.

25. The method of claim 22 further comprising the steps of:
   determining the position of the substrate with respect to the first mask; and
   moving the first mask based on the position of the substrate.

26. The method of claim 25 further comprising the steps of:
   determining the position of the substrate with respect to the second mask; and
   moving the second mask based on the position of the substrate.

27. The method of claim 26 wherein the step for determining the position of the substrate with respect to the first mask and the step for moving the first mask are repeated until the position of the substrate with respect to the first mask is within a first desired tolerance, and the step for determining the position of the substrate with respect to the second mask and the step for moving the second mask are repeated until the position of the substrate with respect to the second mask is within a second desired tolerance.

* * * * *